US009559116B2

(12) United States Patent
Kim et al.

(10) Patent No.: US 9,559,116 B2
(45) Date of Patent: Jan. 31, 2017

(54) SEMICONDUCTOR DEVICE

(71) Applicant: Samsung Electronics Co., Ltd., Suwon-si (KR)

(72) Inventors: Hongsoo Kim, Seongnam-si (KR); HunKook Lee, Hwaseong-si (KR); Jeehoon Hwang, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/695,051

(22) Filed: Apr. 24, 2015

(65) Prior Publication Data

US 2016/0049422 A1 Feb. 18, 2016

(30) Foreign Application Priority Data

Aug. 14, 2014 (KR) ........................ 10-2014-0106108

(51) Int. Cl.
*H01L 27/115* (2006.01)

(52) U.S. Cl.
CPC ..... *H01L 27/11582* (2013.01); *H01L 27/1157* (2013.01); *H01L 27/11565* (2013.01)

(58) Field of Classification Search
None
See application file for complete search history.

(56) References Cited

U.S. PATENT DOCUMENTS 8,063,438 B2 11/2011 Son et al.
8,492,797 B2 7/2013 Hwang et al.
2011/0291172 A1* 12/2011 Hwang ............. H01L 27/11578 257/314
2012/0115293 A1* 5/2012 Noh .................. H01L 27/10855 438/239
2012/0314514 A1 12/2012 Kwon et al.
2013/0009236 A1* 1/2013 Lee .................. H01L 27/11556 257/329
2013/0134377 A1 5/2013 Park et al.
2013/0193395 A1* 8/2013 Lee ...................... H01L 27/249 257/4

(Continued)

FOREIGN PATENT DOCUMENTS

KR 10-2009-0113606 A 11/2009

*Primary Examiner* — Khaja Ahmad
(74) *Attorney, Agent, or Firm* — Muir Patent Law, PLLC

(57) ABSTRACT

A semiconductor device may include an insulating layer provided in one body on a substrate, a first gate electrode and a second gate electrode disposed on the insulating layer, the first and second gate electrodes extending in a first direction parallel to a top surface of the substrate, a first channel structure penetrating the first gate electrode and the insulating layer so as to be connected to the substrate, a second channel structure penetrating the second gate electrode and the insulating layer so as to be connected to the substrate, and a contact penetrating the insulating layer between the first gate electrode and the second gate electrode. The contact may be connected to a common source region formed in the substrate, and the common source region may have a first conductivity type. Further, the first gate electrode and the second gate electrode may be spaced apart from each other in a second direction at the same level from the substrate, wherein the second direction intersects the first direction and is parallel to the top surface of the substrate.

20 Claims, 25 Drawing Sheets

(56) References Cited

U.S. PATENT DOCUMENTS

| | | | |
|---|---|---|---|
| 2013/0214344 | A1 | 8/2013 | Lim et al. |
| 2013/0228852 | A1 | 9/2013 | Kitazaki et al. |
| 2013/0285006 | A1 | 10/2013 | Park et al. |
| 2013/0320486 | A1 | 12/2013 | Yoo et al. |
| 2014/0042519 | A1 | 2/2014 | Lee |
| 2014/0097484 | A1 | 4/2014 | Seol et al. |

* cited by examiner

SEMICONDUCTOR DEVICE

CROSS-REFERENCE TO RELATED APPLICATION

This U.S. non-provisional patent application claims priority under 35 U.S.C. §119 to Korean Patent Application No. 10-2014-0106108, filed on Aug. 14, 2014, in the Korean Intellectual Property Office, the disclosure of which is hereby incorporated by reference in its entirety.

BACKGROUND

The present disclosure relates to semiconductor devices and, more particularly, to three-dimensional (3D) semiconductor memory devices including three-dimensionally arranged memory cells.

Semiconductor devices have been highly integrated to provide high performance and low costs. The integration density of semiconductor devices may directly affect the costs of the semiconductor devices, so highly integrated semiconductor devices have been demanded. An integration density of a conventional two-dimensional (2D) or planar memory device may be mainly determined by an area which a unit memory cell occupies. Therefore, the integration density of the conventional 2D memory device may be greatly affected by a technique of forming fine patterns. However, since extremely high-priced apparatuses are needed to form fine patterns, the integration density of 2D memory devices continues to increase but is still limited.

Three-dimensional (3D) semiconductor devices including three-dimensionally arranged memory cells have been developed to overcome the above limitations. However, production of 3D semiconductor memory devices may be expensive as compared with 2D semiconductor memory devices and may cause concerns regarding providing reliable device characteristics.

SUMMARY

Embodiments of the inventive concepts provide 3D semiconductor memory devices capable of improving stability and an integration density.

In one aspect, a semiconductor device may include: an insulating layer provided in one body on a substrate; a first gate electrode and a second gate electrode disposed on the insulating layer, the first and second gate electrodes extending in a first direction parallel to a top surface of the substrate; a first channel structure penetrating the first gate electrode and the insulating layer so as to be connected to the substrate; a second channel structure penetrating the second gate electrode and the insulating layer so as to be connected to the substrate; and a contact penetrating the insulating layer between the first gate electrode and the second gate electrode, the contact connected to a common source region formed in the substrate, and the common source region having a first conductivity type. The first gate electrode and the second gate electrode may be spaced apart from each other in a second direction at the same level from the substrate. The second direction may intersect the first direction and may be parallel to the top surface of the substrate.

In some embodiments, the insulating layer, the first gate electrode, and the second gate electrode may constitute a unit structure, and the unit structure may include a plurality of unit structures repeatedly stacked on the substrate. The first gate electrodes stacked with the insulating layers interposed therebetween may constitute a first gate electrode structure, and the second gate electrodes stacked with the insulating layers interposed therebetween may constitute a second gate electrode structure. The first gate electrode structure and the second gate electrode structure may be spaced apart from each other in the second direction with the contact interposed therebetween.

In some embodiments, each of the first and second gate electrodes may include a depressed sidewall, and the depressed sidewalls may be adjacent to the contact. The contact may be surrounded by the depressed sidewalls when viewed from a plan view.

In some embodiments, a distance between the contact and an inner sidewall of the insulating layer adjacent to the contact may be smaller than a distance between the contact and each of the depressed sidewalls.

In some embodiments, the insulating layer may support both the first gate electrode and the second gate electrode, and the insulating layer may include a through-hole penetrating the insulating layer between the first and second gate electrodes. The contact may be disposed in the through-hole when viewed from a plan view.

In some embodiments, the contact may include a plurality of contacts, and the contacts may be arranged along the first direction and be spaced apart from each other. Each of the first and second gate electrodes includes a protruding sidewall, and the protruding sidewalls may be disposed between the contacts adjacent to each other.

In some embodiments, the semiconductor device may further include: a common source line extending in the first direction. The common source line may be disposed on the contacts and may be electrically connected to the contacts.

In some embodiments, the semiconductor device may further include: a bit line extending in the second direction. The bit line may be disposed on the first and second channel structures and may be electrically connected to the first and second channel structures. The bit line may be vertically spaced apart from the common source line.

In some embodiments, the contact may include a plurality of contacts. The contacts may be arranged in the first direction and may be spaced apart from each other. At least one of the contacts may be connected to a well pickup region formed in the substrate, and the well pickup region may have a second conductivity type.

In some embodiments, the semiconductor device may further include: a gate dielectric layer covering top surfaces and bottom surfaces of the first and second gate electrodes and disposed between the first gate electrode and the first channel structure and between the second gate electrode and the second channel structure. The gate dielectric layer may extend to cover a top surface and an inner sidewall of the insulating layer.

In some embodiments, the first channel structure may include a plurality of first channel structures. The first channel structures may be arranged in the first direction and may be spaced apart from each other. The second channel structure may include a plurality of second channel structures. The second channel structures may be arranged in the first direction and may be spaced apart from each other. The contact may include a plurality of contacts. The contacts may be arranged in the first direction between the first channel structures and the second channel structures and may be spaced apart from each other. The insulating layer may surround sidewalls of the first channel structures, sidewalls of the second channel structures, and sidewalls of the contacts.

In some embodiments, the semiconductor device may further include: a first vertical insulator disposed between the first gate electrode and the first channel structure; and a second vertical insulator disposed between the second gate electrode and the second channel structure. Each of the first and second vertical insulators may include a charge storage layer.

In some embodiments, the first channel structure may penetrate the first gate electrode structure, and the second channel structure may penetrate the second gate electrode structure.

In another aspect, a semiconductor device may include: an insulating layer disposed on a substrate; and a first gate electrode and a second gate electrode disposed on the insulating layer, the first and second gate electrodes extending in a first direction parallel to a top surface of the substrate. The first gate electrode may include: first depressed sidewalls; and first protruding sidewalls of which each is defined by two, adjacent to each other, of the first depressed sidewalls. The second gate electrode may include: second depressed sidewalls; and second protruding sidewalls of which each is defined by two, adjacent to each other, of the second depressed sidewalls. The insulating layer may be provided in one body to support both the first gate electrode and the second gate electrode. The first gate electrode and the second gate electrode may be spaced apart from each other in a second direction at the same level from the substrate. The second direction may intersect the first direction and may be parallel to the top surface of the substrate.

In some embodiments, the semiconductor device may further include: a common source line vertically spaced apart from the substrate and the first and second gate electrodes. The common source line may extend in the first direction, and the common source line may be disposed between the first gate electrode and the second gate electrode when viewed from a plan view.

In some embodiments, the insulating layer may include a plurality of insulating layers, the first gate electrode may include a plurality of first gate electrodes, and the second gate electrode may include a plurality of second gate electrodes. The insulating layers, the first gate electrodes, and the second gate electrodes may be repeatedly stacked on the substrate. The first gate electrodes may be vertically stacked with the insulating layers interposed therebetween and may constitute a first gate electrode structure. The second gate electrodes may be vertically stacked with the insulating layers interposed therebetween and may constitute a second gate electrode structure. The first gate electrode structure may be spaced apart from the second gate electrode structure in the second direction with the common source line interposed therebetween when viewed from a plan view.

In some embodiments, the semiconductor device may further include: a contact penetrating the insulating layer and disposed between the first gate electrode and the second gate electrode. The contact may be disposed between the substrate and the common source line, and the common source line may be electrically connected to the substrate through the contact.

In some embodiments, one of the first depressed sidewalls and one of the second depressed sidewalls may be adjacent to the contact, and the contact may be surrounded by the one of the first depressed sidewalls and the one of the second depressed sidewalls when viewed from a plan view.

In some embodiments, the semiconductor device may further include: first channel structures penetrating the first gate electrode and the insulating layer so as to be connected to the substrate, the first channel structures arranged in the first direction; and second channel structures penetrating the second gate electrode and the insulating layer so as to be connected to the substrate, the second channel structures arranged in the first direction.

In still another aspect, a semiconductor device may include: a stack structure including gate electrodes and insulating layers that are alternately and repeatedly stacked on a substrate; a common source line disposed on the stack structure and extending in a first direction parallel to a top surface of the substrate; and channel structures penetrating the stack structure and arranged in the first direction, the channel structures spaced apart from each other. Each of the gate electrodes may be divided into segments that are spaced apart from each other in a second direction with the common source line interposed therebetween when viewed from a plan view. Each of the insulating layers may be not divided in the second direction under the common source line. The second direction may intersect the first direction and may be parallel to the top surface of the substrate.

BRIEF DESCRIPTION OF THE DRAWINGS

Various aspects of the inventive concepts will become more apparent in view of the attached drawings and accompanying detailed description.

DETAILED DESCRIPTION

Figure 1:
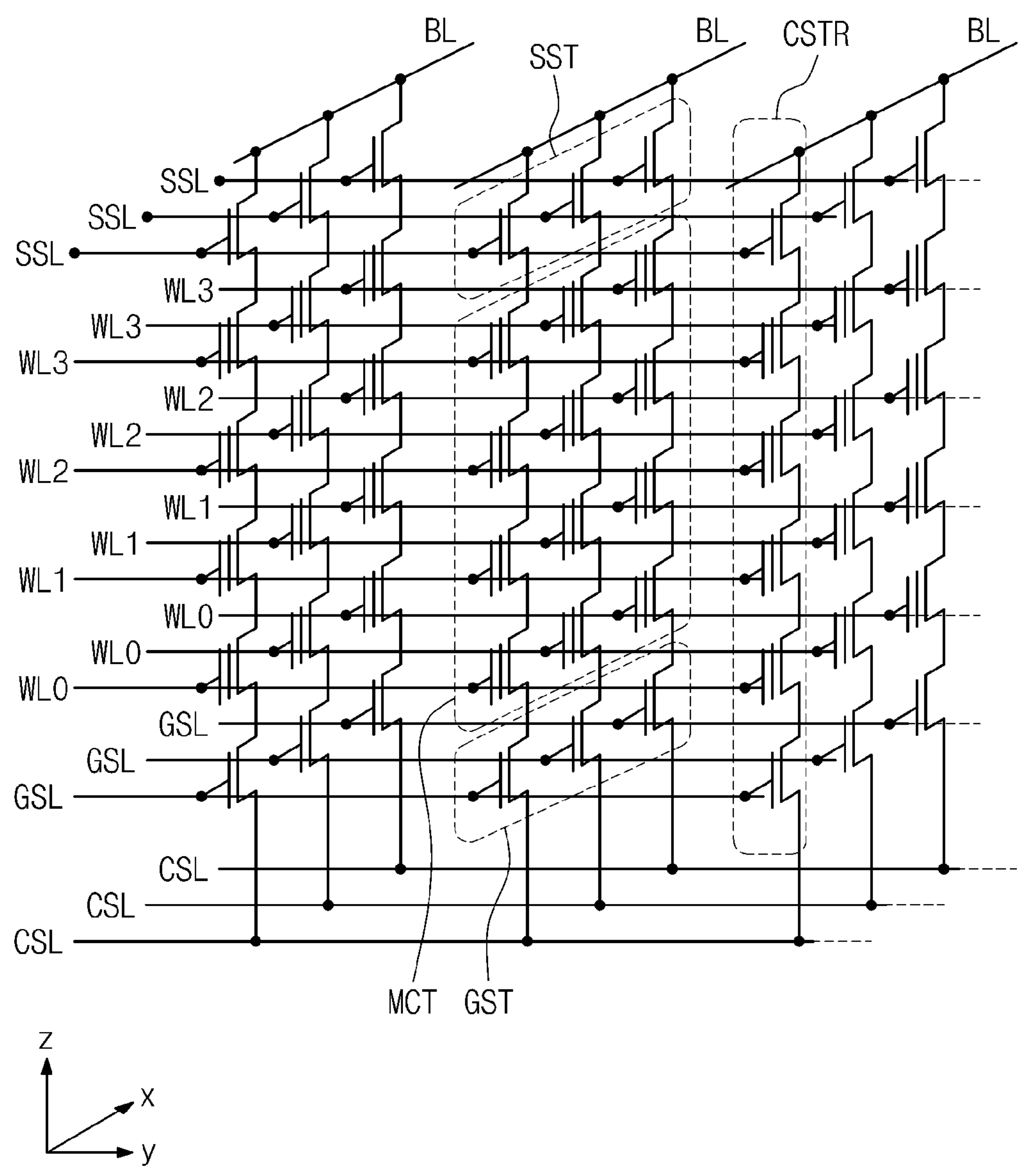
FIG. 1 is a schematic circuit diagram illustrating a cell array of a 3D semiconductor memory device according to embodiments of the inventive concepts.

Various aspects of the inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Also, the term "contact," as used herein refers to direct contact (i.e., touching) unless the context indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element, for example as a naming convention. Thus, a first element in some embodiments could be termed a second element in other embodiments or in certain claims without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIG. 1 is a schematic circuit diagram illustrating a cell array of a 3D semiconductor memory device according to embodiments of the inventive concepts.

Referring to FIG. 1, a cell array of a 3D semiconductor memory device according to embodiments of the inventive concepts may include a common source line CSL, a plurality of bit lines BL, and a plurality of cell strings CSTR disposed between the common source line CSL and the bit lines BL.

The common source line CSL may be a conductive layer disposed on a substrate or a dopant region formed in the substrate. In the present embodiments, the common source line CSL may be a conductive pattern (e.g., a metal line) that is spaced apart from the substrate so as to be disposed over the substrate. The bit lines BL may be conductive patterns (e.g., metal lines) that are spaced apart from the substrate so as to be disposed over the substrate. In the present embodiments, the bit lines BL may intersect the common source line CSL and may be vertically spaced apart from the common source line CSL. The bit lines BL may be two-dimensionally arranged and a plurality of the cell strings CSTR may be connected in parallel to each of the bit lines BL. The cell strings CSTR may be connected in common to the common source line CSL. For example, a plurality of cell strings CSTR may be disposed between the common source line CSL and the plurality of bit lines BL. In some embodiments, the common source line CSL may be provided in plurality, and the plurality of common source lines CSL may be two-dimensionally arranged. The same voltage may be applied to the plurality of the common source lines CSL. Alternatively, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other.

The common source line CSL may be connected in common to sources of the ground selection transistors GST. A ground selection line GSL, a plurality of word lines WL0 to WL3, and a string selection line SSL which are disposed between the common source line CSL and the bit lines BL may be used as gate electrodes of the ground selection transistor GST, the memory cell transistors MCT and the string selection transistor SST, respectively. Each of the memory cell transistors MCT may include a data storage element.

Figure 2:
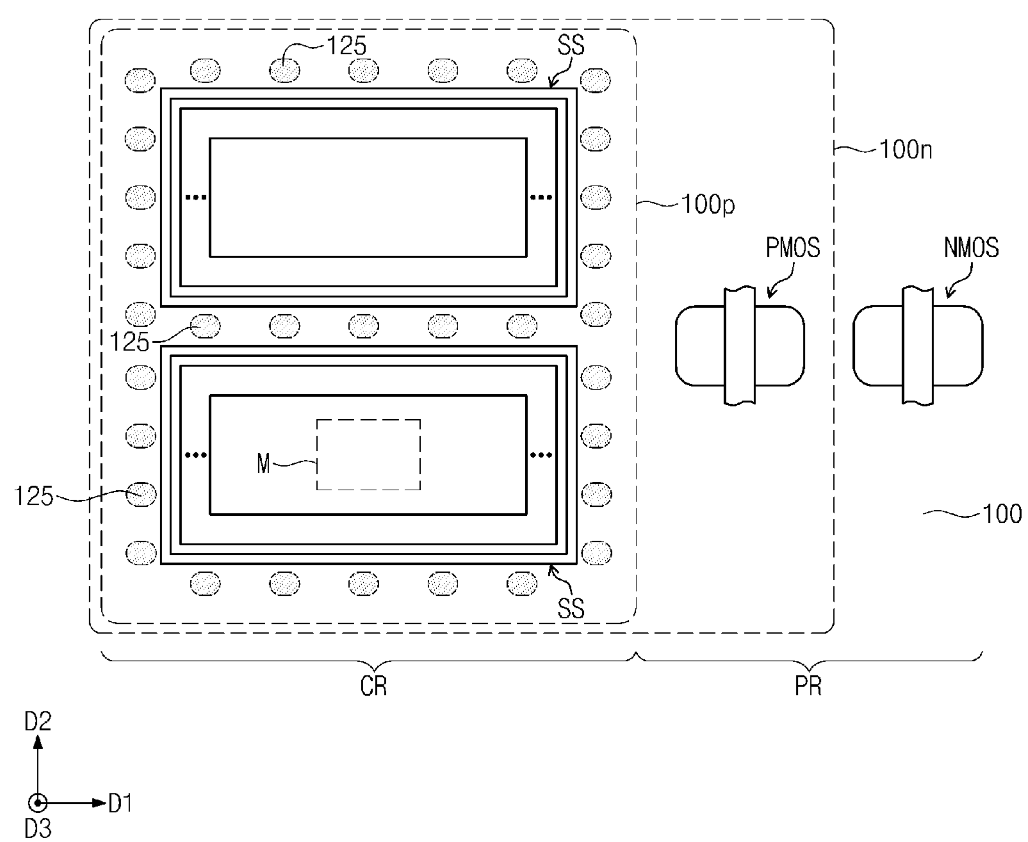
FIG. 2 is a plan view illustrating a 3D semiconductor memory device according to embodiments of the inventive concepts.

FIG. 2 is a plan view illustrating a 3D semiconductor memory device according to embodiments of the inventive concepts.

Referring to FIG. 2, a substrate 100 may include a cell region CR and a peripheral circuit region PR on the periphery of the cell region CR. The substrate 100 may be, for example, a silicon substrate, a silicon-germanium substrate, a germanium substrate, or a single-crystalline epitaxial layer grown on a single-crystalline silicon substrate.

In some embodiments, the substrate 100 may have a first conductivity type. The substrate 100 may include a well dopant layer **100*n* having a second conductivity type opposite to the first conductivity type, and a pocket-well dopant layer 100*p* having the first conductivity type. The pocket-well dopant layer 100*p* may be disposed in the well dopant layer 100*n*. In more detail, the well dopant layer 100*n* may be formed by injecting dopants of the second conductivity type into the substrate 100. The pocket-well dopant layer 100*p* may be formed by injecting dopants of the first conductivity type into the well dopant layer 100*n***.

In some embodiments, memory cell arrays may be formed on the pocket-well dopant layer **100*p* of the cell region CR, and peripheral circuits (e.g., PMOS and NMOS transistors) may be formed on the well dopant layer 100*n* of the peripheral circuit region PR and the substrate 100 of the peripheral circuit region PR. In more detail, a plurality of stack structures SS may be disposed on the pocket-well dopant layer 100*p*. Each of the stack structures SS may include a plurality of gate electrodes vertically stacked on the substrate 100. This will be described in more detail with reference to FIGS. 3A, 3B, and 3**C.

According to the present embodiments, well pickup regions 125 may be formed in the pocket-well dopant layer **100*p* around the stack structures SS. In some embodiments, the well pickup regions 125 may also be disposed between the stack structures SS. This will be described in more detail with reference to FIGS. 6A, 6B, and 6C. The well pickup regions 125 may be doped with dopants of the same conductivity type as the pocket-well dopant layer 100*p*. Here, a dopant concentration of the well pickup region 125 may be higher than that of the pocket-well dopant layer 100*p*. According to the present embodiments, a high erasing voltage (e.g., about 20V) may be applied to the pocket-well dopant layer 100*p* through the well pickup regions 125 during an erasing operation of the 3D semiconductor memory device. At this time, since the well pickup regions 125 are disposed around the stack structures SS and between the stack structures SS, the erasing voltage may be uniformly applied to the pocket-well dopant layer 100*p***.

PMOS transistors PMOS may be disposed on the well dopant layer **100*n* of the peripheral circuit region PR, NMOS transistors NMOS may be disposed on the substrate 100** of the peripheral circuit region PR.

Figure 3A:
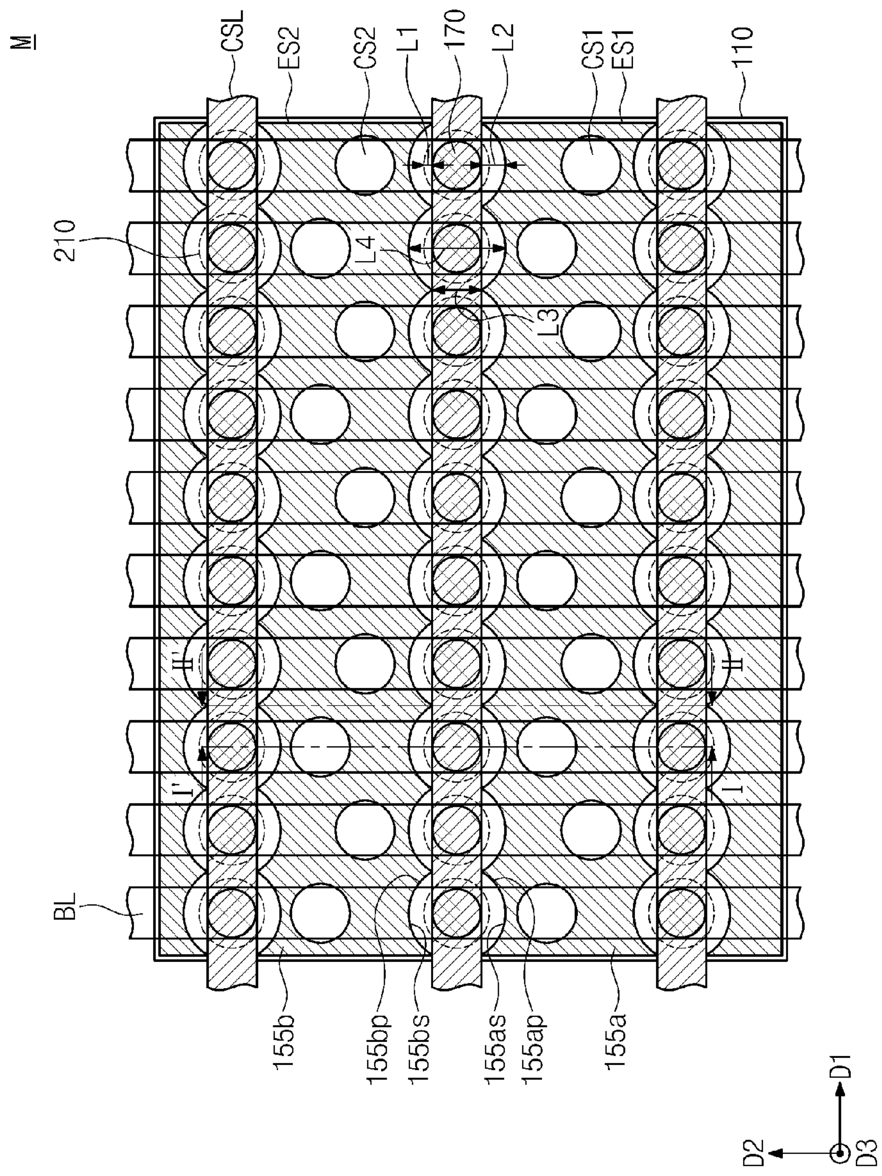
FIG. 3A is an enlarged plan view of a portion 'M' of FIG. 2 to illustrate a cell region of a 3D semiconductor memory device according to some embodiments of the inventive concepts.
Figure 3B:
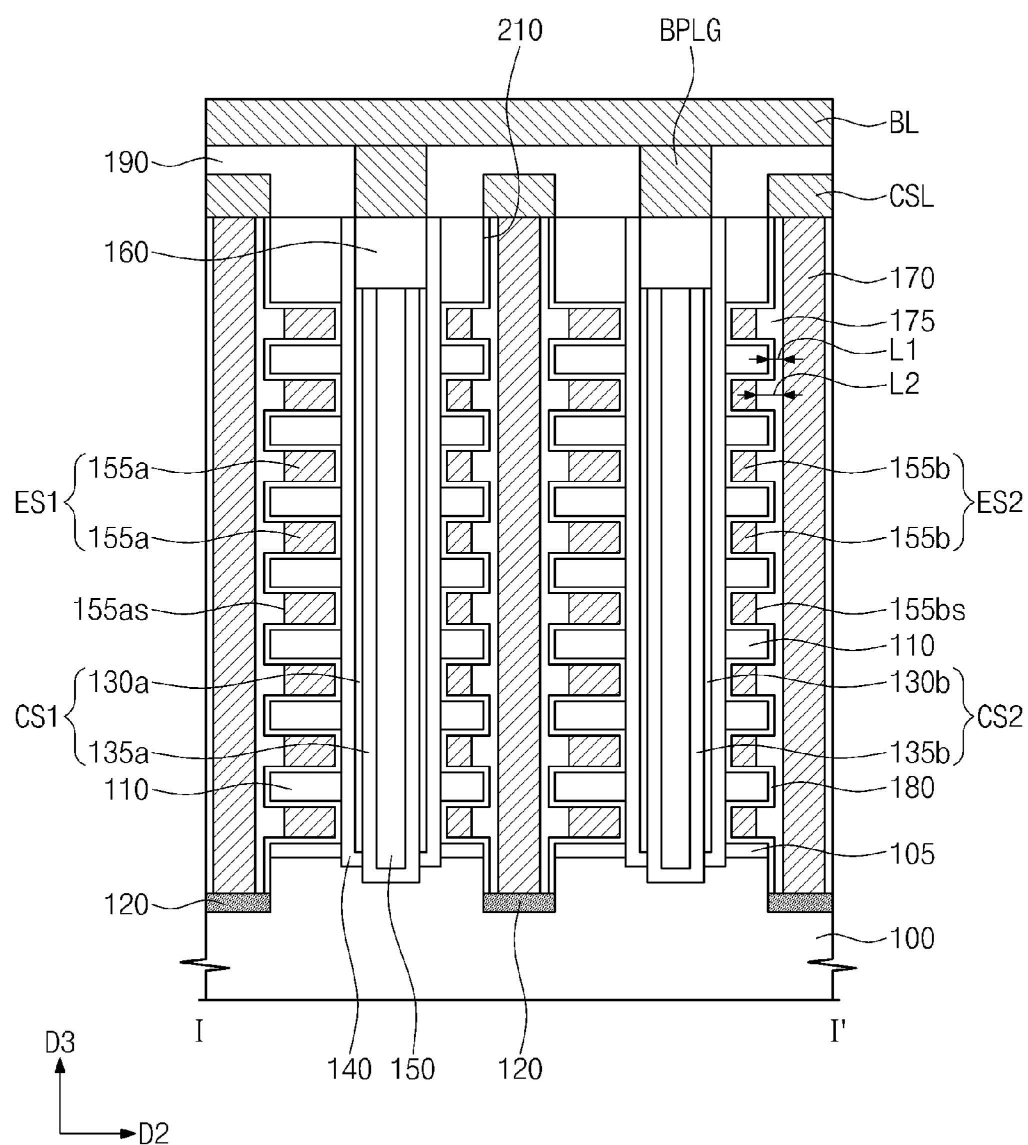
FIG. 3B is a cross-sectional view taken along a line I-I' of FIG. 3A, according to one embodiment.

FIG. 3A is an enlarged plan view of a portion 'M' of FIG. 2 to illustrate a cell region of a 3D semiconductor memory device according to some embodiments of the inventive concepts. FIG. 3B is a cross-sectional view taken along a line I-I' of FIG. 3A, and FIG. 3C is a cross-sectional view taken along a line II-II' of FIG. 3A.

Figure 3C:
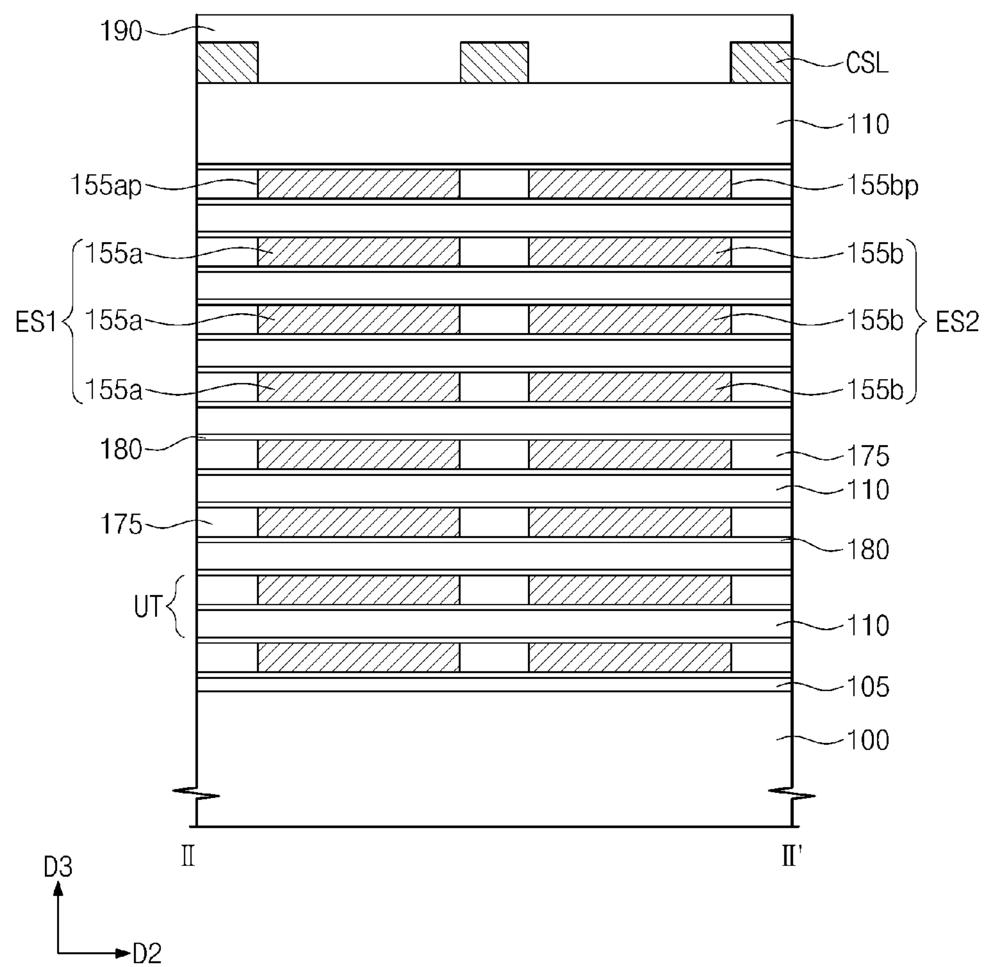
FIG. 3C is a cross-sectional view taken along a line II-II' of FIG. 3A, according to one embodiment.

Referring to FIGS. 3A to 3C, gate electrodes **155*a* and 155*b* and insulating layers 110 may be alternately and repeatedly stacked on a substrate 100. The substrate 100** may be, for example, a silicon substrate, a germanium substrate, or a silicon-germanium substrate. The substrate

100 may include common source regions 120 doped with dopants. When viewed from a plan view, the common source regions 120 may correspond to shapes of through-holes 210. For example, a planar shape of the common source region 120 may be a circular shape. The common source regions 120 may be spaced apart from each other and may be arranged in a first direction D1 parallel to a top surface of the substrate 100. Each of the insulating layers 110 may include, for example, a silicon layer, a silicon oxide layer, a silicon carbide layer, a silicon oxynitride layer, or a silicon nitride layer.

In the present embodiment, the gate electrodes 155*a* and 155*b* may include first gate electrodes 155*a* and second gate electrodes 155*b*. Other gate electrodes may be further disposed to be spaced apart from the gate electrodes 155*a* and 155*b*. The present embodiment illustrates the first and second gate electrodes 155*a* and 155*b* as an example. The first gate electrodes 155*a* may be stacked with the insulating layers 110 interposed therebetween and may be defined as a first gate electrode structure ES1. The second gate electrodes 155*b* may be stacked with the insulating layers 110 interposed therebetween and may be defined as a second gate electrode structure ES2. The first gate electrode structure ES1 may be spaced apart from the second gate electrode structure ES2 in a second direction D2. The second direction D2 may be parallel to the top surface of the substrate 100 and may intersect the first direction D1. The first gate electrode structure ES1 and the second gate electrode structure ES2 may have line shapes extending in the first direction D1.

In some embodiments, lowermost gate electrodes 155*a* and 155*b* of the first and second gate electrode structures ES1 and ES2 may be used as the gate electrodes of the ground selection transistors GST described with reference to FIG. 1. In addition, uppermost gate electrodes 155*a* and 155*b* of the first and second gate electrode structures ES1 and ES2 may be used as the gate electrodes of the string selection transistors SST described with reference to FIG. 1. The gate electrodes 155*a* and 155*b* between the lowermost and uppermost gate electrodes may be used as the gate electrodes of the memory cell transistors MCT.

When viewed from a plan view, the common source regions 120 may be disposed between the first gate electrode structure ES1 and the second gate electrode structure ES2. A lower insulating layer 105 may be disposed between the substrate 100 and the lowermost first gate electrode 155*a* and the substrate 100 and the lowermost second gate electrode 155*b*. The lower insulating layer 105 may include, for example, a silicon oxide layer. The lower insulating layer 105 may be thinner than the insulating layers 110.

In another viewpoint, each of stack structures SS according to the present embodiment may include unit structures UT that are repeatedly stacked. Each of the unit structures UT may include the insulating layer 110, the first gate electrode 155*a* disposed on a portion of the insulating layer 110, and the second gate electrode 155*b* disposed on another portion of the insulating layer 110. For example, the first gate electrode 155*a* and the second gate electrode 155*b* may be disposed on one insulating layer 110 formed in one body, as illustrated in FIG. 3C.

A plurality of channel structures CS1 and CS2 may penetrate the unit structures UT and may be electrically connected to the substrate 100. The channel structures CS1 and CS2 may extend in a third direction D3 that may be perpendicular to the first and second directions D1 and D2. The channel structures CS1 and CS2 may be spaced apart from each other and be arranged along the first direction when viewed from a plan view, as illustrated in FIG. 3A. The channel structures CS1 and CS2 may include first channel structures CS1 and second channel structures CS2.

The first channel structures CS1 may penetrate the insulating layers 110 and the first gate electrodes 155*a*, and the second channel structures CS2 may penetrate the insulating layers 110 and the second gate electrodes 155*b*. For example, all the first and second channel structures CS1 and CS2 may penetrate the insulating layers 110. As described above, since the first and second gate electrode structures ES1 and ES2 are spaced apart from each other in the second direction D2, the first channel structures CS1 may also be spaced apart from the second channel structures CS2 in the second direction D2. The first channel structures CS1 may be arranged in a zigzag form along the first direction D1. Likewise, the second channel structures CS2 may be arranged in a zigzag form along the second direction D2.

Each of the first channel structures CS1 may include a first vertical semiconductor pattern 130*a* and a first connection semiconductor pattern 135*a* that penetrate the first gate electrode structure ES1 and the insulating layers 110 so as to be electrically connected to the substrate 100. The first vertical semiconductor pattern 130*a* may cover inner sidewalls of the first gate electrode structure ES1 and first inner sidewalls of the insulating layers 110. The first vertical semiconductor pattern 130*a* may have a pipe or macaroni shape of which a top end and a bottom end are opened. In one embodiment, the first vertical semiconductor pattern 130*a* is not in contact with the substrate 100 but is spaced apart from the substrate 100. The first connection semiconductor pattern 135*a* may have a pipe or macaroni shape of which a bottom end is closed. An inner region of the first connection semiconductor pattern 135*a* may be filled with a vertical insulating pattern 150. The first connection semiconductor pattern 135*a* may be in contact with an inner sidewall of the first vertical semiconductor pattern 130*a* and the substrate 100.

The first vertical and connection semiconductor patterns 130*a* and 135*a* may include a semiconductor material. The first vertical and connection semiconductor patterns 130*a* and 135*a* may include, for example, silicon (Si), germanium (Ge), or a combination thereof. The first vertical and connection semiconductor patterns 130*a* and 135*a* may be doped with dopants or may be in an undoped state or an intrinsic state. The first vertical and connection semiconductor patterns 130*a* and 135*a* may be in a single-crystalline state, an amorphous state, or a poly-crystalline state. If the semiconductor patterns 130*a* and 135*a* are doped with dopants, a conductivity type of the semiconductor patterns 130*a* and 135*a* may be the same as that of the substrate 100.

Each of the second channel structures CS2 may include a second vertical semiconductor pattern 130*b* and a second connection semiconductor pattern 135*b* that penetrate the second gate electrode structure ES2 and the insulating layers 110 so as to be electrically connected to the substrate 100. The second vertical and connection semiconductor patterns 130*b* and 135*b* may be the same as the first vertical and connection semiconductor patterns 130*a* and 135*a*.

A conductive pad 160 may be provided on each of the first and second channel structures CS1 and CS2. A top surface of the conductive pad 160 may be substantially coplanar with a top surface of an uppermost insulating layer 110, and a bottom surface of the conductive pad 160 may contact the first vertical and connection semiconductor patterns 130*a* and 135*a* or the second vertical and connection semiconductor patterns 130*b* and 135*b*. The conductive pad 160 may be a dopant region doped with dopants or may include a conductive material.

Vertical insulators 140 may be disposed between the first gate electrode structure ES1 and the first channel structures CS1 and between the second gate electrode structure ES2 and the second channel structures CS2. Each of the vertical insulators 140 may have a pipe or macaroni shape of which a top end and a bottom end are opened. In some embodiments, the vertical insulators 140 may contact the substrate 100.

The vertical insulators 140 may include memory elements of a flash memory device. For example, each of the vertical insulators 140 may include a charge storage layer of the flash memory device. Alternatively, the vertical insulator 140 may include another thin layer capable of storing data, for example, a thin layer for a phase change memory or a thin layer for a variable resistance memory. In some embodiments, each of the vertical insulators 140 may include the charge storage layer and a tunnel dielectric layer that are sequentially stacked. In other embodiments, each of the vertical insulators 140 may further include a blocking dielectric layer that is disposed between the charge storage layer and each of the first and second gate electrodes 155*a* and 155*b*. In still other embodiments, each of the vertical insulators 140 may further include a capping layer (not shown) disposed between each of the first and second channel structures CS1 and CS2 and each of the insulating layers 110.

The charge storage layer may include at least one of a silicon nitride layer, a silicon oxynitride layer, a silicon-rich nitride layer, a nano-crystalline silicon layer, or a laminated trap layer. The tunnel dielectric layer may include a material of which an energy band gap is greater than that of the charge storage layer. For example, the tunnel dielectric layer may include a silicon oxide layer. The blocking dielectric layer may include a material of which an energy band gap is greater than that of the charge storage layer. For example, the blocking dielectric layer may include at least one of a silicon oxide layer, a silicon nitride layer, or a silicon oxynitride layer. The capping layer may include at least one of a silicon layer, a silicon oxide layer, a poly-silicon layer, a silicon carbide layer, or a silicon nitride layer. Here, the capping layer may include a different material from the insulating layers 110. In other embodiments, the capping layer may include at least one of high-k dielectric layers such as a tantalum oxide ($Ta_2O_5$) layer, a titanium oxide ($TiO_2$) layer, a hafnium oxide ($HfO_2$) layer, and a zirconium oxide ($ZrO_2$) layer.

A gate dielectric layer 180 that covers top surfaces and bottom surfaces of the first and second gate electrodes 155*a* and 155*b* may be disposed between the first gate electrodes 155*a* and the insulating layers 110 and between the second gate electrodes 155*b* and the insulating layers 110, respectively. In addition, the gate dielectric layer 180 may also be disposed between the first gate electrodes 155*a* and the first channel structures CS1 and between the second gate electrodes 155*b* and the second channel structures CS2. In some embodiments, the vertical insulators 140 may be disposed between the first channel structure CS1 and the gate dielectric layer 180 and between the second channel structure CS2 and the gate dielectric layer 180, respectively. In addition, the gate dielectric layer 180 may further extend to cover second inner sidewalls of the insulating layers 110. The second inner sidewalls of the insulating layers 110 may define the through-holes 210. As described above, the insulating layers 110 may include the first inner sidewalls adjacent to the channel structures CS1 and CS2 and the second inner sidewalls defining the through-holes 210.

The gate dielectric layer 180 may be formed of a single layer or a plurality of layers. In some embodiments, the gate dielectric layer 180 may include a blocking dielectric layer of a charge trap-type flash memory device. In other embodiments, the gate dielectric layer 180 may include a plurality of blocking dielectric layers. In still other embodiments, the gate dielectric layer 180 may include a charge storage layer and the blocking dielectric layer of the charge trap-type flash memory device.

The through-holes 210 may be formed between the first gate electrode structure ES1 and the second gate electrode structure ES2. The through-holes 210 may be formed in the insulating layers 110. The through-holes 210 may be arranged in the first direction D1 and be spaced apart from each other. The through-holes 210 may penetrate the insulating layers 110 so as to extend vertically.

Contacts 170 connected to the common source regions 120 may be disposed in the through-holes 210, respectively. For example, the contacts 170 may penetrate the insulating layers 110 and may be disposed between the first and second gate electrode structures ES1 and ES2. In one embodiment, the first gate electrode structure ES1 may be spaced apart from the second gate electrode structure ES2 in the second direction D2 with the contacts 170 interposed therebetween. However, since each of the insulating layers 110 is formed in one body, it may not be separated by the contacts 170 when viewed from a plan view. For example, the insulating layers 110 may surround sidewalls of the first channel structures CS1, sidewalls of the second channel structures CS2, and sidewalls of the contacts 170.

Spacers 175 may be disposed between the contacts 170 and the insulating layers 110, between the first gate electrode ES1 and the contacts 170, and between the second gate electrode ES2 and the contacts 170. The spacers 175 may electrically insulate the first and second gate electrodes 155*a* and 155*b* from the contacts 170. The spacers 175 may include at least one of a silicon layer, a silicon oxide layer, a silicon carbide layer, a silicon oxynitride layer, or a silicon nitride layer.

Common source lines CSL may be disposed on the stack structures SS including the first and second gate electrodes ES1 and ES2 and the insulating layers 110. The common source lines CSL may extend in the first direction D1 and may be spaced apart from each other in the second direction D2. In the present embodiment, the common source lines CSL may be conductive patterns (e.g., metal lines) that are vertically spaced apart from the top surface of the substrate 100.

The common source lines CSL may be formed on the contacts 170 so as to be electrically connected to the contacts 170. Each of the common source lines CSL may overlap with the contacts 170 arranged along the first direction D1 when viewed from a plan view. Even though not shown in the drawings, a contact plug may be disposed between each of the common source lines CSL and the each of the contacts 170. In this case, the common source lines CSL may be electrically connected to the contacts 170 through the contact plugs. A voltage may be applied to the common source regions 120 connected to the contacts 170 through the common source lines CSL spaced apart from the substrate 100.

A first interlayer insulating layer 190 may be disposed to cover the common source lines CSL. A bit line plug BPLG may penetrate the first interlayer insulating layer 190 so as to be electrically connected to each of the conductive pads 160.

Bit lines BL may be disposed on the first interlayer insulating layer 190 and may intersect the stack structures SS. The bit lines BL may extend in the second direction D2 and may be spaced apart from each other in the first direction D1. The bit lines BL may be vertically spaced apart from the common source lines CSL and may intersect the common source lines CSL. The bit lines BL may be connected to the conductive pads 160 through the bit line plugs BPLG. Each of the bit lines BL may be connected to the first channel structure CS1 and the second channel structure CS2 which are arranged in the second direction D2.

Referring again to FIGS. 3A and 3B, each of the first gate electrodes 155*a* of the first gate electrode structure ES1 may include first depressed sidewalls 155*as* and first protruding sidewalls 155*ap*. The first depressed, or recessed, sidewall 155*as* may be laterally depressed toward a center of the first gate electrode 155*a* when viewed from a plan view. The first protruding sidewall 155*ap* may laterally protrude in a direction far away from the center of the first gate electrode 155*a* when viewed from a plan view. Each of the second gate electrodes 155*b* of the second gate electrode structure ES2 may include second depressed sidewalls 155*bs* and second protruding sidewalls 155*bp*.

When viewed from a plan view, the first depressed sidewalls 155*as* may be adjacent to the contacts 170. In more detail, the first depressed sidewalls 155*as* may correspond to planar shapes of the through-holes 210 and may surround the contacts 170. The first depressed sidewalls 155*as* may be spaced apart from the contacts 170. A first distance L1 between the contact 170 and the second inner sidewall of the insulating layer 110 which defines the through-hole 210 may be smaller than a second distance L2 between the contact 170 and the first depressed sidewall 155*as*. Features of the second depressed sidewalls 155*bs* may be the same as those of the first depressed sidewalls 155*as* described above.

Each of the first protruding sidewalls 155*ap* may be disposed between the contacts 170 adjacent to each other. In addition, each of the first protruding sidewalls 155*ap* may be defined between the first depressed sidewalls 155*as* adjacent to each other. A third distance L3 between the first protruding sidewall 155*ap* and the second protruding sidewall 155*bp* may be smaller than a fourth distance L4 between the first depressed sidewall 155*as* and the second depressed sidewall 155*bs*. Features of the second protruding sidewalls 155*bp* may be the same as those of the first protruding sidewalls 155*ap* described above.

The first depressed sidewall 155*as* and the second depressed sidewall 155*bs* may face, or be opposite, each other in the second direction D2, and the first protruding sidewall 155*ap* and the second protruding sidewall 155*bp* may face, or be opposite each other in the second direction D2.

According to some embodiments of the inventive concepts, structural stability of the 3D semiconductor memory device may be improved. This is because the first and second gate electrodes 155*a* and 155*b* separated from each other are supported by the insulating layers 110 of which each is formed in one body. For example, even though the number of stacked gate electrodes increases in the stack structures SS, the insulating layers 110 can support the first and second gate electrode structures ES1 and ES2 to prevent the stack structures SS from leaning. In addition, it is possible to solve or prevent modification and resistance increase problems of the first and second gate electrodes 155*a* and 155*b* which may be caused by stress of a metal layer.

Moreover, since the common source lines CSL may be the conductive patterns (e.g., metal lines) spaced apart from the substrate 100, it is possible to prevent a defect (e.g., seam) from occurring in the common source lines CSL. As a result, even though lengths of the common source lines CSL increase, it is possible to reduce or remove a resistance increase of the common source lines CSL and to improve a contact badness issue between the common source lines CSL and the common source regions 120 formed in the substrate 100.

Figure 4A:
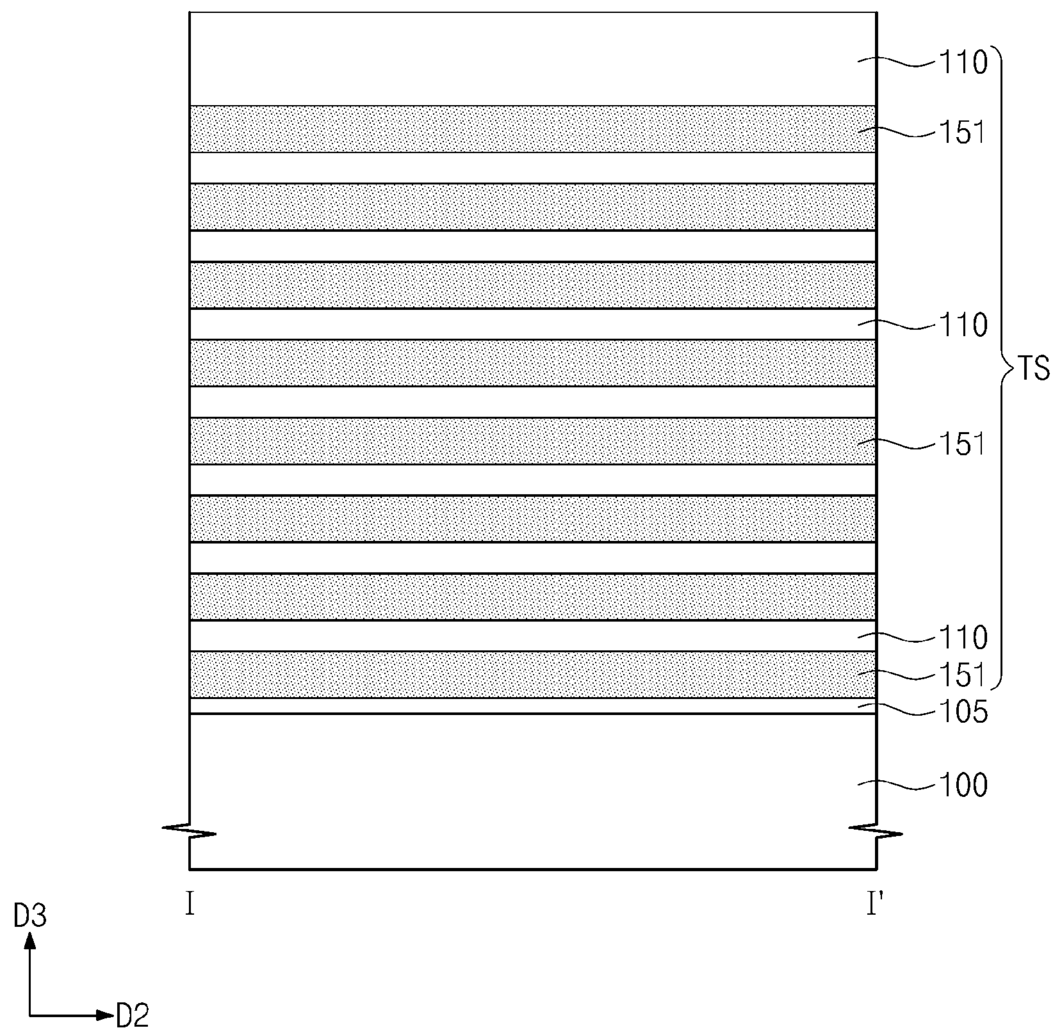
FIGS. 4A to 4G are cross-sectional views corresponding to a line I-I' of FIG. 3A to illustrate a method for manufacturing a 3D semiconductor memory device according to some embodiments of the inventive concepts.
Figure 4B:
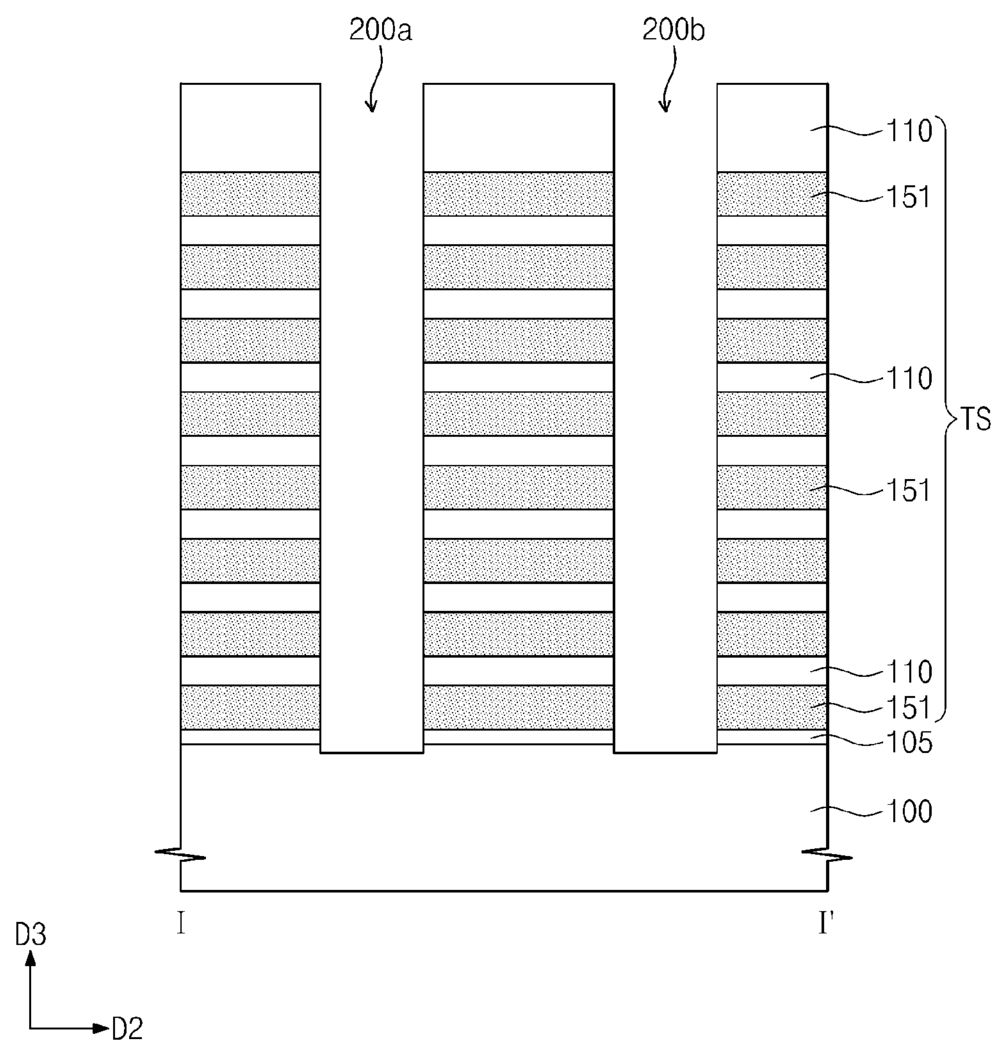
Figure 4C:
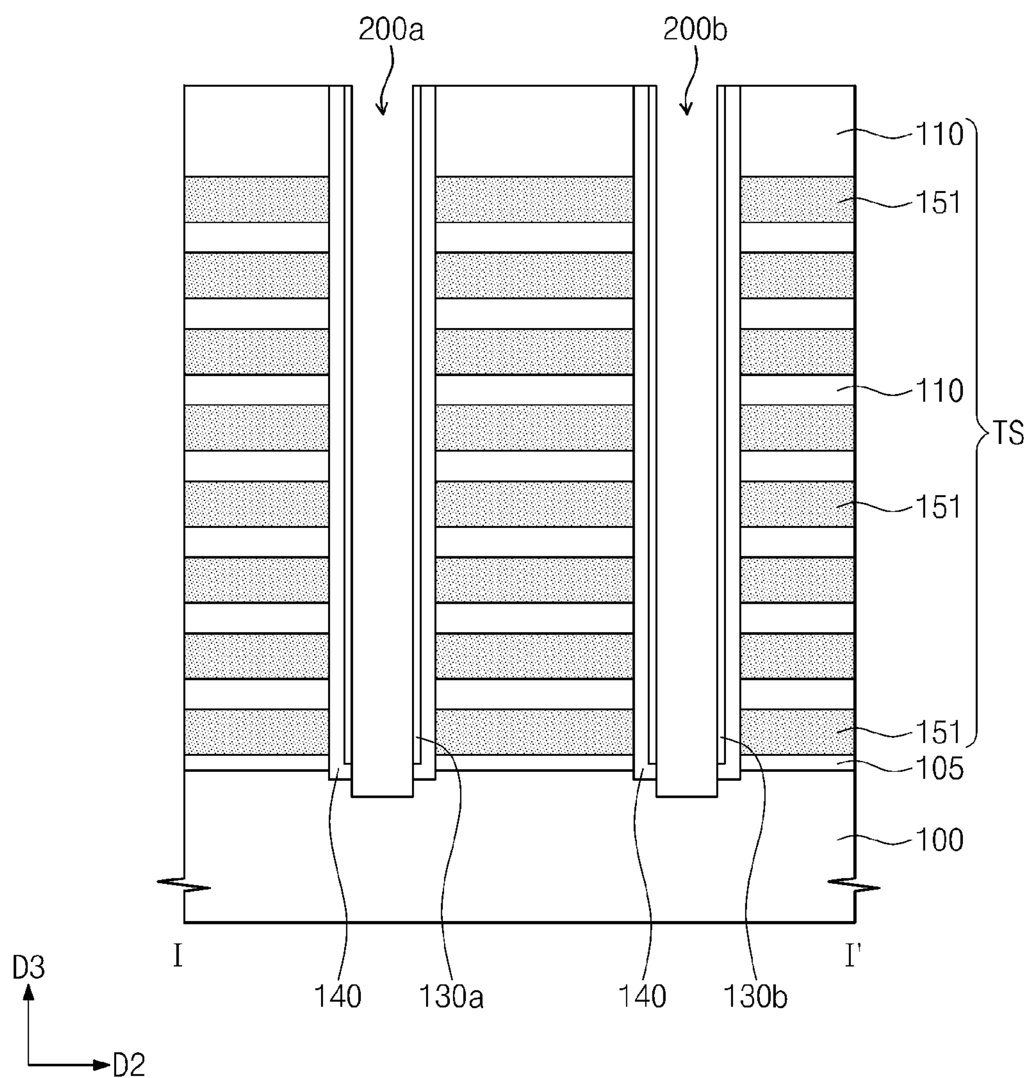
Figure 4D:
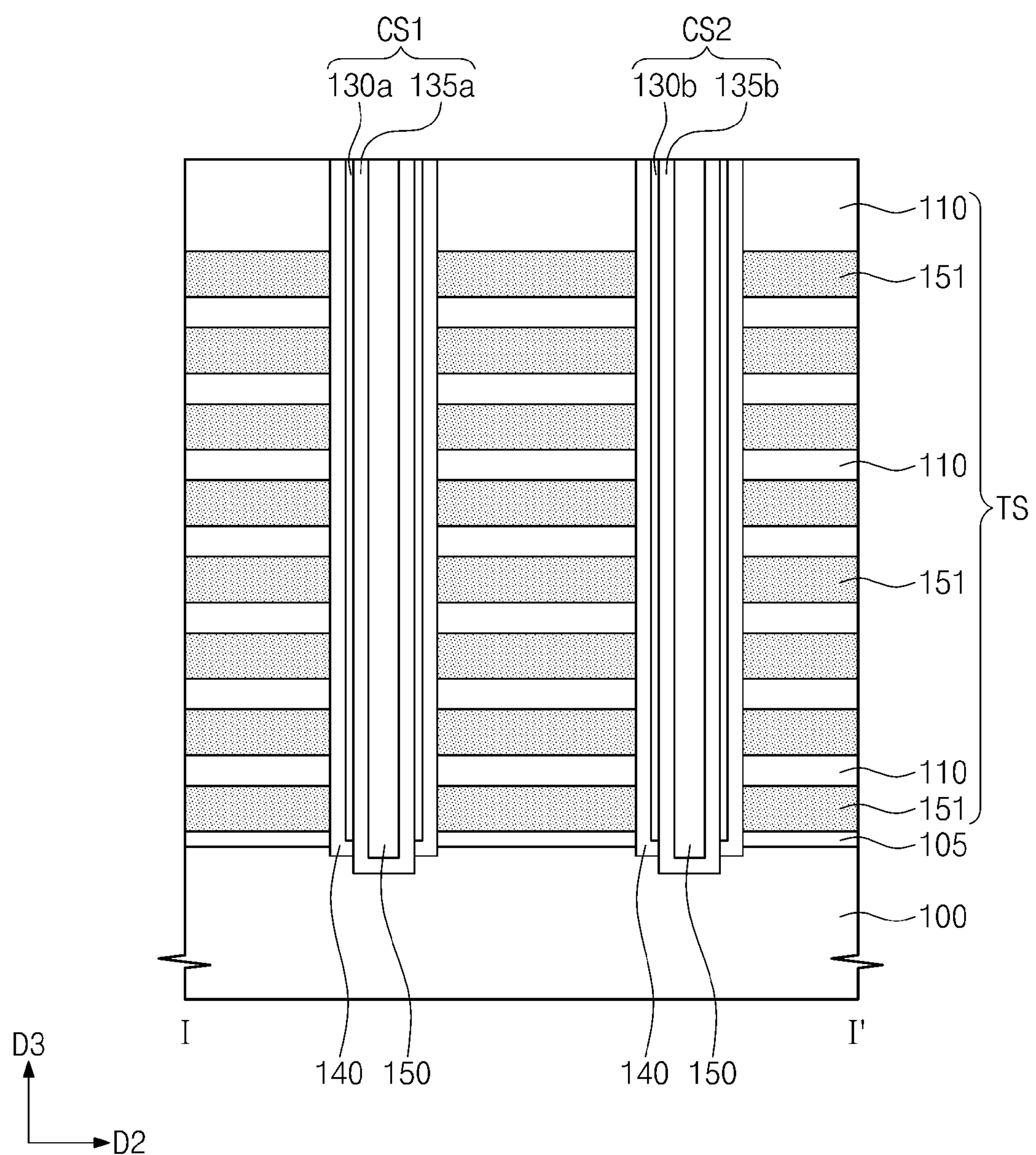
Figure 4E:
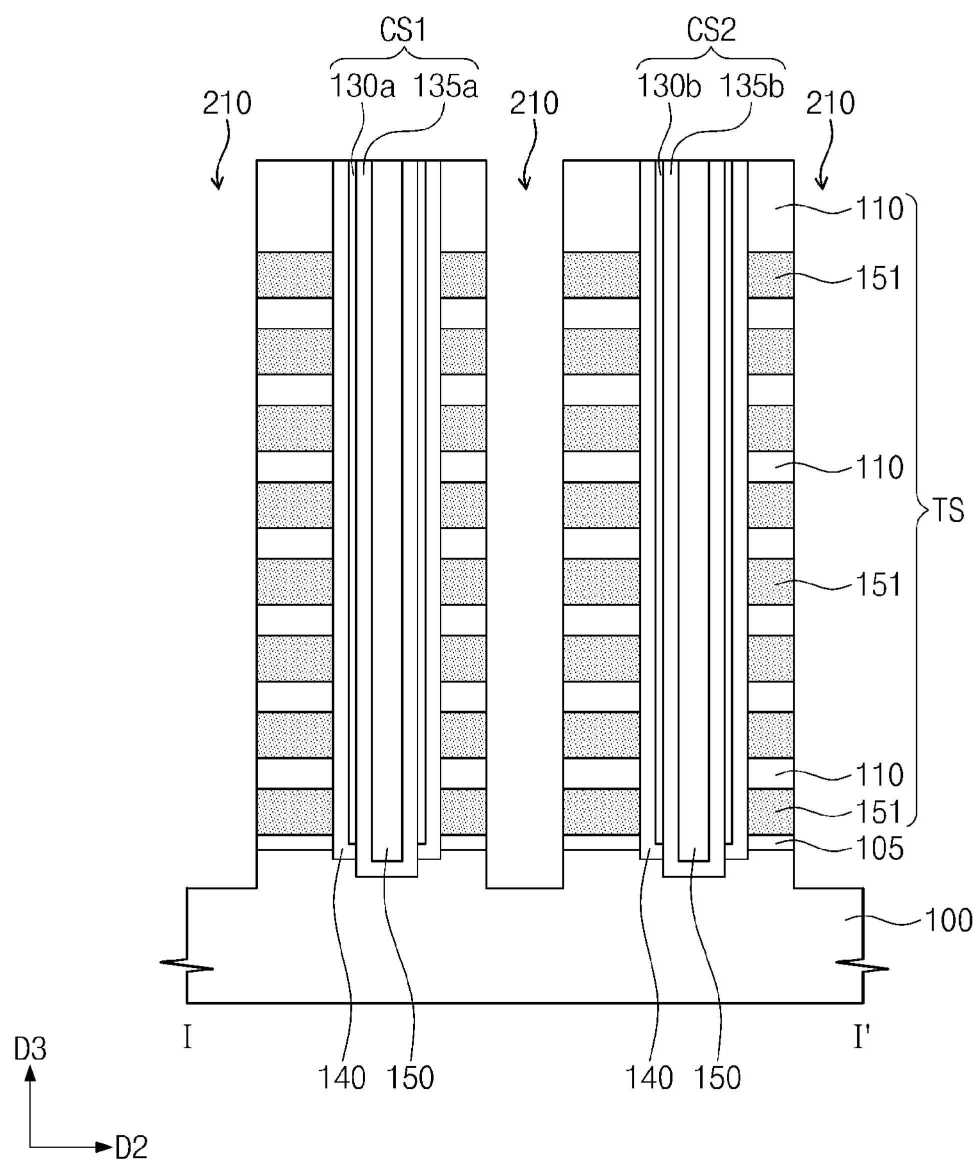
Figure 4F:
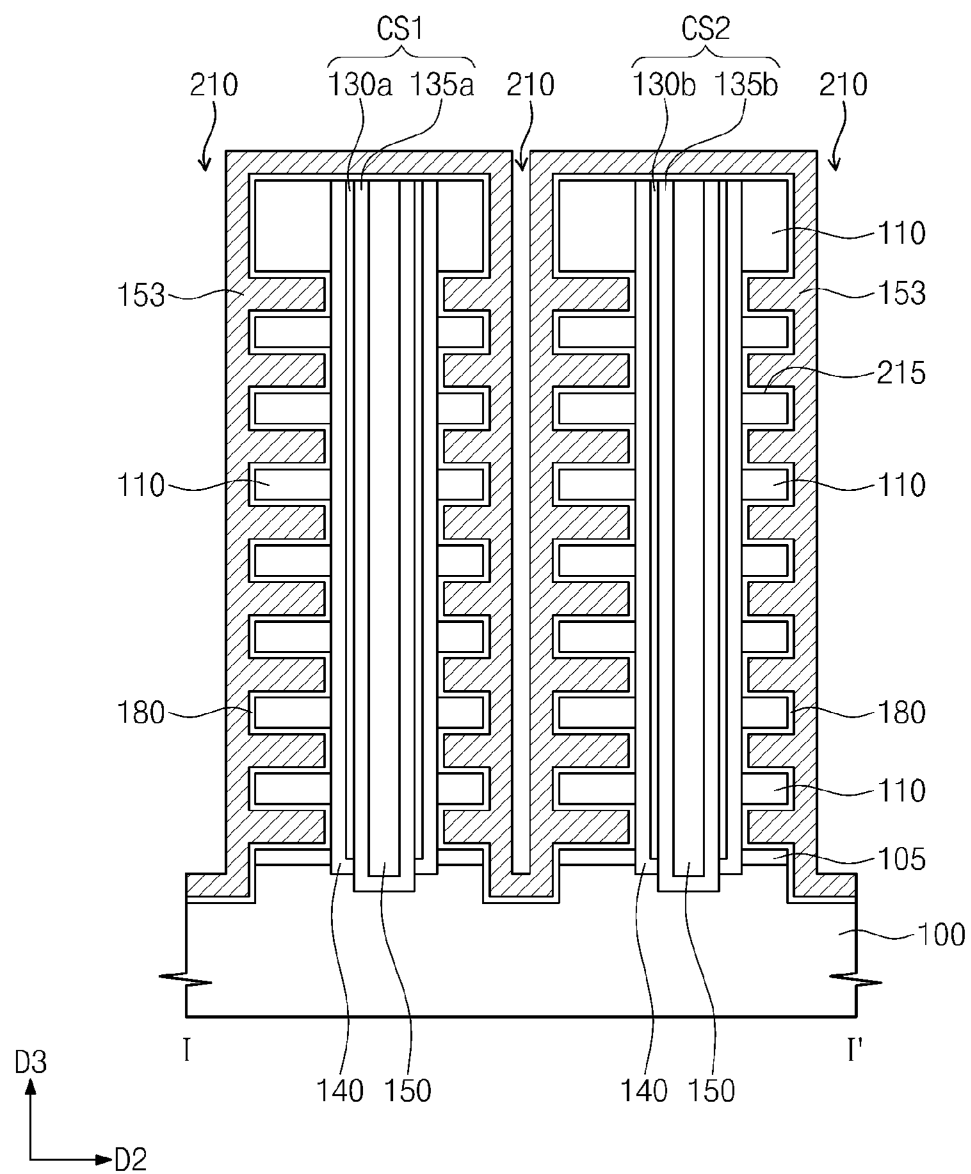
Figure 4G:
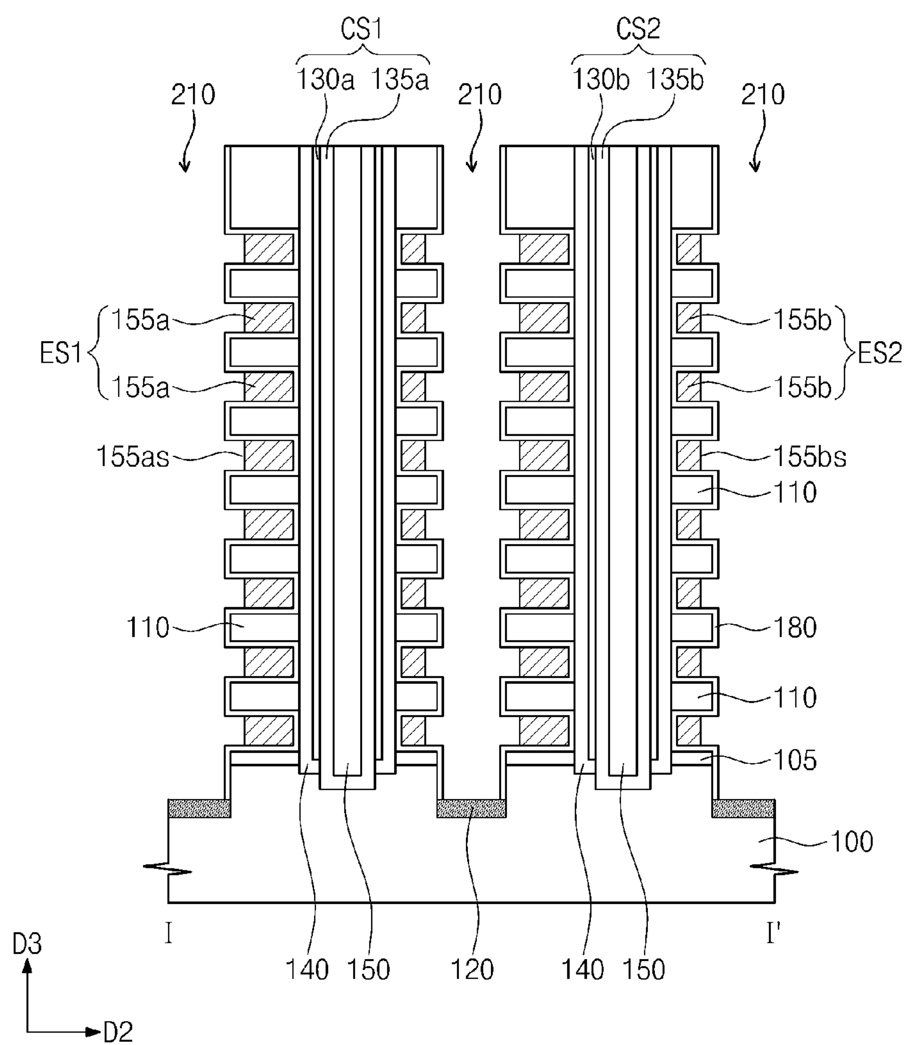
Figure 5A:
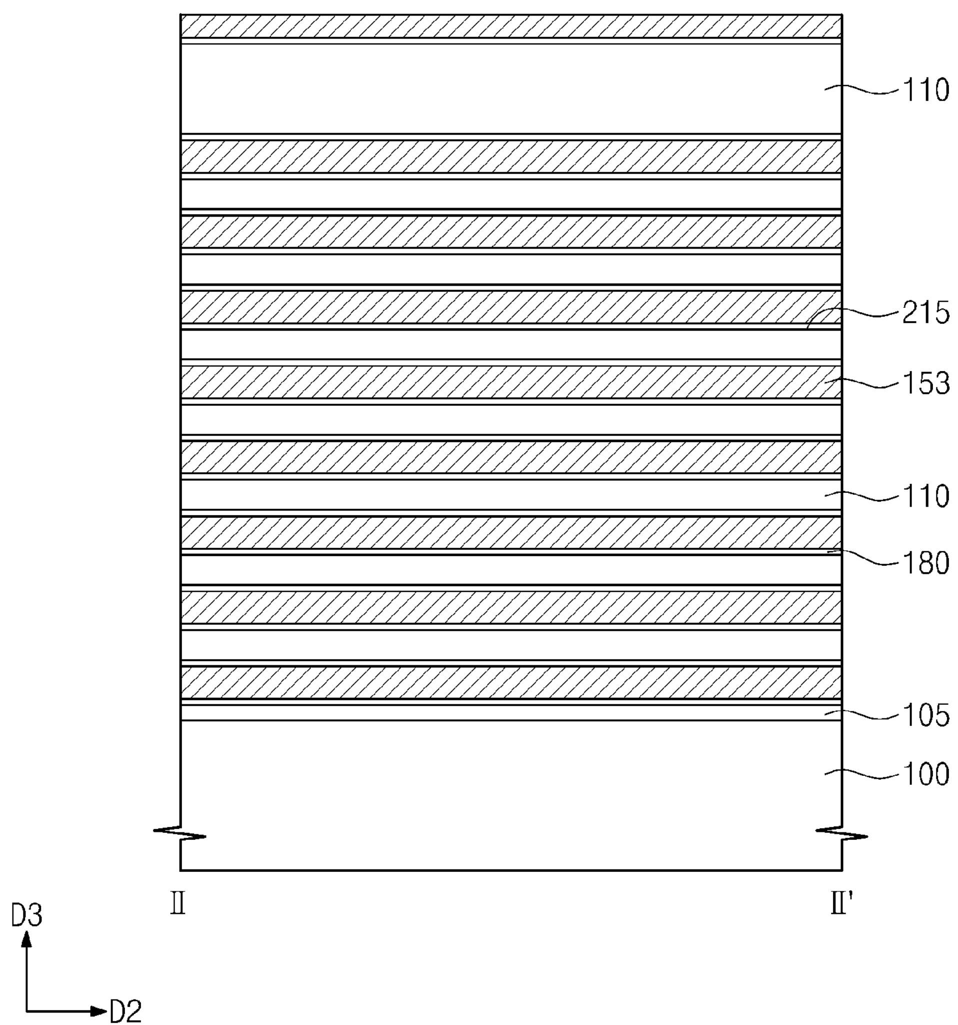
FIGS. 5A and 5B are cross-sectional views corresponding to a line II-II' of FIG. 3A to illustrate a method for manufacturing a 3D semiconductor memory device according to some embodiments of the inventive concepts.
Figure 5B:
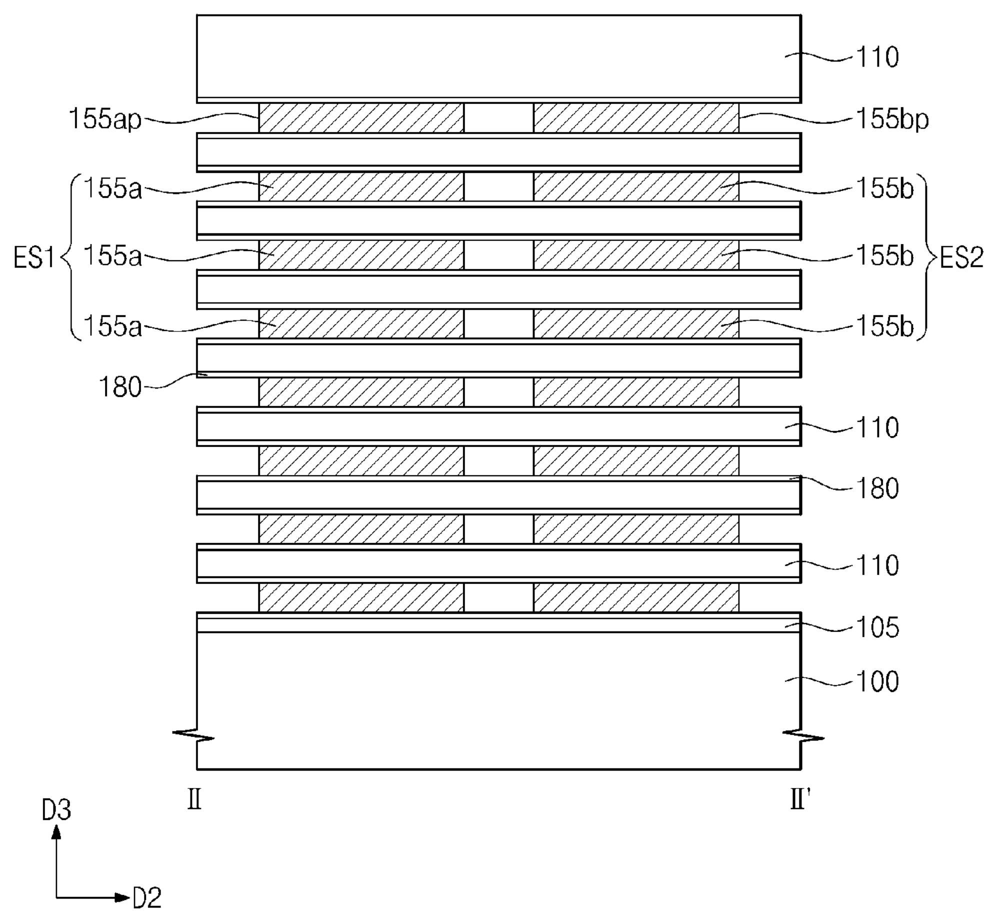

FIGS. 4A to 4G and 5A and 5B are cross-sectional views illustrating a method for manufacturing a 3D semiconductor memory device according to some embodiments of the inventive concepts. FIGS. 4A to 4G are cross-sectional views corresponding to a line I-I' of FIG. 3A, according to one embodiment. FIGS. 5A and 5B are cross-sectional views corresponding to a line II-II' of FIG. 3A, according to one embodiment.

Referring to FIGS. 3A and 4A, sacrificial layers 151 and insulating layers 110 may be alternately and repeatedly formed on the substrate 100 to form a thin layer structure TS. For example, the substrate 100 may be a silicon substrate, a germanium substrate, or a silicon-germanium substrate.

The sacrificial layers 151 may be formed of a material having an etch selectivity with respect to the insulating layers 110. According to the present embodiment, a difference between an etch rate of the sacrificial layers 151 and an etch rate of the insulating layers 110 may be greater in a wet etching process using a chemical solution but may be smaller in a dry etching process using an etching gas.

According to one embodiment, the sacrificial layers 151 may have the same thickness. According to another embodiment, a lowermost one and an uppermost one of the sacrificial layers 151 may be thicker than the others of the sacrificial layers 151 interposed therebetween. The insulating layers 110 may each have the same thickness. Alternatively, a thickness of at least one of the insulating layers 110 may be different from those of others of the insulating layers 110.

Each of the sacrificial layers 151 and the insulating layers 110 may be formed, for example, by a thermal chemical vapor deposition (thermal CVD) process, a plasma-enhanced CVD process, a physical CVD process, or an atomic layer deposition (ALD) process.

In some embodiments, the sacrificial layers 151 and the insulating layers 111 may be formed of insulating materials of which etch rates are different from each other. For example, each of the sacrificial layers 151 may include a silicon layer, a silicon oxide layer, a silicon carbide layer, a silicon oxynitride layer, or a silicon nitride layer. Each of the insulating layers 110 may include a silicon layer, a silicon oxide layer, a silicon carbide layer, a silicon oxynitride layer, or a silicon nitride layer. In one embodiment, the insulating layers 110 are formed of a different material from the sacrificial layers 151. For example, the sacrificial layers 151 may be formed of a silicon nitride layer, and the insulating layers 110 may be formed of a silicon oxide layer. In other embodiments, the sacrificial layers 151 may be formed of a conductive material, and the insulating layers 110 may be formed of an insulating material.

In addition, a lower insulating layer 105 may be formed between the substrate 100 and the thin layer structure TS. For example, the lower insulating layer 105 may be a silicon oxide layer that is formed by a thermal oxidation process. Alternatively, the lower insulating layer 105 may be a silicon oxide layer that is formed by a deposition technique. The lower insulating layer 105 may be thinner than the sacrificial layers 151 and the insulating layers 110.

Referring to FIGS. 3A and 4B, first channel holes 200*a* and second channel holes 200*b* may be formed to penetrate the thin layer structure TS and the lower insulating layer 105. The first and second channel holes 200*a* and 200*b* may expose the substrate 100. The first channel holes 200*a* may be arranged along a first direction D1 parallel to the top surface of the substrate 100 when viewed from a plan view. The second channel holes 200*b* may be arranged along the first direction D1. The first channel holes 200*a* may be spaced apart from the second channel holes 200*b* in a second direction D2 intersecting the first direction D1. In other embodiments, the first channel holes 200*a* may be arranged in a zigzag form along the first direction D1 and the second channel holes 200*b* may be arranged in a zigzag form along the first direction D1, like the first and second channel structures CS1 and CS2 illustrated in FIG. 3A.

A first mask pattern (not shown) that has openings defining the first and second channel holes 200*a* and 200*b* may be formed on the thin layer structure TS. The thin layer structure TS and the lower insulating layer 105 may be etched using the first mask pattern as an etch mask to form the first and second channel holes 200*a* and 200*b*. The first mask pattern may be formed of a material having an etch selectivity with respect to the sacrificial layers 151 and the insulating layers 110. The top surface of the substrate 100 under the channel holes 200*a* and 200*b* may be recessed by over-etching during the etching process. In addition, a width of a lower portion of each of the first and second channel holes 200*a* and 200*b* may be smaller than that of an upper portion of each of the first and second channel holes 200*a* and 200*b* by the etching process. Thereafter, the first mask pattern may be removed.

Referring to FIGS. 3A and 4C, vertical insulators 140 and vertical semiconductor patterns 130*a* and 130*b* may be formed to cover inner sidewalls of the first and second channel holes 200*a* and 200*b*. The vertical insulators 140 and the vertical semiconductor patterns 130*a* and 130*b* may expose the substrate 100 disposed under the first and second channel holes 200*a* and 200*b*. The vertical semiconductor patterns 130*a* and 130*b* may include first vertical semiconductor patterns 130*a* and second vertical semiconductor patterns 130*b*. In detail, a vertical insulating layer and a vertical semiconductor layer that cover the inner sidewalls of the channel holes 200*a* and 200*b* may be sequentially formed on the substrate 100 having the channel holes 200*a* and 200*b*. The vertical insulating layer and the vertical semiconductor layer may partially fill the first and second channel holes 200*a* and 200*b*. The sum of thicknesses of the vertical insulating layer and the vertical semiconductor layer may be smaller than a half of a width of each of the first and second channel holes 200*a* and 200*b*. In other words, the first and second channel holes 200*a* and 200*b* may not be completely filled with the vertical insulating layer and the vertical semiconductor layer. The vertical insulating layer may cover the top surface of the substrate exposed by the first and second channel holes 200*a* and 200*b*. The vertical insulating layer may be formed of a plurality of layers. For example, the vertical insulating layer may be formed by at least one of a plasma-enhanced CVD process, a physical CVD process, or an ALD process.

The vertical insulating layer may include a charge storage layer used as a memory element of a flash memory device. The charge storage layer may be a trap insulating layer or an insulating layer including conductive nano dots. Alternatively, the vertical insulating layer may include a thin layer for a phase change memory or a thin layer for a variable resistance memory.

In some embodiments, the vertical insulating layer may include a blocking dielectric layer, the charge storage layer, and a tunnel dielectric layer which are sequentially stacked. The blocking dielectric layer may cover sidewalls of the first sacrificial layers 151, sidewalls of the insulating layers 110, and the top surface of the substrate 100 which are exposed by the first and second channel holes 200*a* and 200*b*. The blocking dielectric layer may be formed of, for example, a silicon oxide layer. For example, the charge storage layer may include at least one of a silicon nitride layer, a silicon oxynitride layer, a silicon-rich nitride layer, a nano-crystalline silicon layer, or a laminated trap layer. The tunnel dielectric layer may include at least one of materials of which energy band gaps are greater than that of the charge storage layer. For example, the tunnel insulating layer may include a silicon oxide layer.

The vertical semiconductor layer may be formed on the vertical insulating layer. In some embodiments, the vertical semiconductor layer may include a semiconductor material (e.g., poly-crystalline silicon, single-crystalline silicon, or amorphous silicon) that is formed using an ALD process or a CVD process.

After the formation of the vertical insulating layer and the vertical semiconductor layer, the vertical semiconductor layer and the vertical insulating layer may be anisotropically etched to expose the substrate 100. Thus, the vertical insulator 140 and the first vertical semiconductor pattern 130*a* may be formed on the inner sidewall of each of the first channel holes 200*a*. In addition, the vertical insulator 140 and the second vertical semiconductor pattern 130*b* may be formed on the inner sidewall of each of the second channel holes 200*b*. Each of the vertical insulators 140 and the vertical semiconductor patterns 130*a* and 130*b* may have a cylindrical shape of which both ends are opened. When the vertical semiconductor layer and the vertical insulating layer are anisotropically etched, the top surface of the substrate 100 may be recessed by over-etching.

In addition, a top surface of the thin layer structure TS may be exposed by the anisotropic etching process performed on the vertical semiconductor layer and the vertical insulating layer. Thus, the vertical insulators 140 and the first and second vertical semiconductor patterns 130*a* and 130*b* may be confinedly formed in the first and second channel holes 200*a* and 200*b*.

Referring to FIGS. 3A and 4D, connection semiconductor patterns 135*a* and 135*b* may be formed on the substrate 100 having the vertical insulators 140 and the first and second vertical semiconductor patterns 130*a* and 130*b*. The connection semiconductor patterns 135*a* and 135*b* may include first connection semiconductor patterns 135*a* and second connection semiconductor patterns 135*b*. In detail, a connection semiconductor layer and a filling insulation layer may be sequentially formed on the resultant structure described with reference to FIG. 4C. The connection semiconductor layer may be conformally formed in the first and second channel holes 200*a* and 200*b* to partially fill the channel holes 200*a* and 200*b*. The connection semiconductor layer may include a semiconductor material (e.g., poly-crystalline silicon, single-crystalline silicon, or amorphous silicon) that is formed using an ALD process or a CVD process. The filling insulation layer may be formed to fully fill the first and second channel holes 200*a* and 200*b*. The filling insulation layer may be one of insulating material layers and a silicon oxide layer that are formed using a spin-on-glass (SOG) technique. Thereafter, the filling insulation layer and the connection semiconductor layer may be planarized to expose the top surface of the thin layer structure TS. Thus, the first connection semiconductor pattern 135*a* and a vertical insulating pattern 150 may be confinedly formed in each of the first channel holes 200*a*, and the second connection semiconductor pattern 135*b* and the vertical insulating pattern 150 may be confinedly formed in each of the second channel holes 200*b*.

Each of the first and second connection semiconductor patterns 135*a* and 135*b* may have a pipe shape having one closed end, a hollow cylindrical shape having one closed end, or a cup shape. However, the inventive concepts are not limited thereto. In other embodiments, the first and second connection semiconductor patterns 135*a* and 135*b* may have pillar shapes filling the first and second channel holes 200*a* and 200*b*. The vertical insulating patterns 150 may fill inner spaces of the first and second connection semiconductor patterns 135*a* and 135*b*, respectively. The first vertical semiconductor pattern 130*a* and the first connection semiconductor pattern 135*a* which are disposed in each of the first channel holes 200*a* may constitute a first channel structure CS1, and the second vertical semiconductor pattern 130*b* and the second connection semiconductor pattern 135*b* which are disposed in each of the second channel holes 200*b* may constitute a second channel structure CS2.

Referring to FIGS. 3A and 4E, through-holes 210 exposing the substrate 100 may be formed to penetrate the thin layer structure TS. The through-holes 210 may further penetrate the lower insulating layer 105 disposed under the thin layer structure TS. The through-holes 210 may be arranged in the first direction D1 to constitute one row when viewed from a plan view. The through-holes 210 of other rows may be spaced apart from the through-holes 210 of the one row with the first channel structures CS1 or the second channel structures CS2 interposed therebetween, as illustrated in FIG. 3A.

In detail, a second mask pattern (not shown) that has openings defining the through-holes 210 may be formed on the thin layer structure TS, and the thin layer structure TS and the lower insulating layer 105 may be etched using the second mask pattern as an etch mask to form the through-holes 210. The second mask pattern may be formed of a material having an etch selectivity with respect to the sacrificial layers 151 and the insulating layers 110. The top surface of the substrate 100 disposed under the through-holes 210 may be recessed by over-etching during the etching process for the formation of the through-holes 210.

The through-holes 210 may be formed to expose sidewalls of the sacrificial layers 151 and the insulating layers 110. In addition, due to the etching process, a width of the through-hole 210 may be varied depending on a vertical height from the substrate 100.

Referring to FIGS. 3A, 4F, and 5A, the sacrificial layers 151 exposed by the through-holes 210 may be selectively removed to form recess regions 215. In some embodiments, the sacrificial layers 151 may be removed by an etching solution provided through the through-holes 210. The recess regions 215 may be gap regions that horizontally extend from the through-holes 210. The recess regions 215 may expose sidewalls of the vertical insulators 140. In addition, the recess regions 215 may also expose top surfaces and bottom surfaces of the insulating layers 110.

A gate dielectric layer 180 may be formed in the recess regions 215. The gate dielectric layer 180 may cover inner surfaces of the recess regions 215. A gate layer 153 (e.g., a metal layer) may be formed on the gate dielectric layer 180 to fill the rest spaces of the recess regions 215. The gate dielectric layer 180 and the gate layer 153 may formed, for example, by providing deposition gases into the recess regions 215 through the through-holes 210.

The gate dielectric layer 180 may include a data storage layer. The gate dielectric layer 180 may consist of a single layer or a plurality of layers, similarly to the vertical insulator 140. In other embodiments, the gate dielectric layer 180 may include a blocking dielectric layer (e.g., a high-k dielectric layer) of a charge trap-type non-volatile memory device.

Referring to FIGS. 3A, 4G, and 5B, the gate layer 153 exposed by the through-holes 210 may be partially etched to form first gate electrodes 155*a* and second gate electrodes 155*b*. In detail, the gate layer 153 may be isotropically etched from the through-holes 210 by an etching solution provided through the through-holes 210. Thus, the gate layer 153 may be divided into the first and second gate electrodes 155*a* and 155*b*. The first gate electrodes 155*a* may be spaced apart from the second gate electrodes 155*b* in the second direction D2. The first gate electrodes 155*a* may have first depressed sidewalls 155*as* adjacent to the through-holes 210, and the second gate electrodes 155*b* may have second depressed sidewalls 155*bs* adjacent to the through-holes 210. In addition, the first gate electrodes 155*a* may also have first protruding sidewalls 155*ap* of which each is disposed between the through-holes 210 adjacent to each other. the second gate electrodes 155*b* may also have second protruding sidewalls 155*bp* of which each is disposed between the through-holes 210 adjacent to each other. The first and second depressed sidewalls 155*as* and 155*bs* may be laterally recessed from the sidewalls, which define the through-holes 210, of the insulating layers 110. Thus, top surfaces and bottom surfaces of the insulating layers 110 adjacent to the through-holes 210 may be exposed. In some embodiments, the gate layer 153 disposed on the uppermost insulating layer 110 and the bottom surfaces of the through-holes 210 may be removed during the formation of the gate electrodes 155*a* and 155*b*. In other embodiments, before the gate layer 153 is isotropically etched using the etching solution, the gate layer 153 disposed on the uppermost insulating layer 110 and the bottom surfaces of the through-holes 210 may be removed by an anisotropic etching process. The gate dielectric layer 180 disposed on the uppermost insulating layer 110 and the bottom surfaces of the through-holes 210 may be removed after the formation of the gate electrodes 155*a* and 155*b*.

Common source regions 120 may be formed in the substrate 100 after the formation of the first and second gate electrodes 155*a* and 155*b*. The common source regions 120 may be formed by an ion implantation process. The common source regions 120 may be formed in the substrate 100 exposed by the through-holes 210. The common source regions 120 and the substrate 100 may constitute PN junctions. In an embodiment for the flash memory device, the common source regions 120 may be electrically connected to each other so as to be in an equipotential state. In other embodiments, the common source regions 120 may be electrically insulated from each other to have different potentials from each other. In still other embodiments, the common source regions 120 may constitute a plurality of source groups. Each of the source groups may include a plurality of the common source regions 120. The source groups may be electrically insulated from each other to have different potentials from each other.

Referring again to FIGS. 3A to 3C, spacers 175 may be formed on the common source regions 120. The spacers 175 may partially fill the through-holes 210. The spacers 175 may cover the sidewalls of the gate electrodes 155*a* and 155*b* and the exposed top and bottom surfaces of the insulating layers 110 which are adjacent to the through-holes 210. In some embodiments, a spacer layer may be conformally deposited on the substrate 100 having the through holes 210, and the deposited spacer layer may be anisotropically etched until the common source regions 120 are exposed, thereby forming the spacers 175. The spacers 175 may include at least one of a silicon layer, a silicon oxide layer, a silicon carbide layer, a silicon oxynitride layer, or a silicon nitride layer.

Contacts 170 may be formed in the through-holes 210 having the spacers 175, respectively. The contacts 170 may be connected to the common source regions 120. The contacts 170 may constitute rows parallel to the first direction D1, and the rows may be spaced apart from each other in the second direction D2. The first and second gate electrodes 155*a* and 155*b* may be electrically insulated from the contacts 170 by the spacers 175 interposed therebetween.

Conductive pads 160 may be formed to be connected to the first and second channel structures CS1 and CS2. In some embodiments, upper portions of the first and second channel structures CS1 and CS2 may be recessed, and the conductive pads 160 may be formed by filling the recessed regions with a conductive material. In some embodiments, the conductive pads 160 may be doped with dopants of which a conductivity type is different from that of the first and second channel structures CS1 and CS2.

Next, common source lines CSL may be formed to be connected to the contacts 170. The common source lines CSL may extend in the first direction D1 and may be spaced apart from each other in the second direction D2. The common source lines CSL may be conductive patterns (e.g., metal lines).

A first interlayer insulating layer 190 may be formed to cover the common source lines CSL. Bit line plugs BPLG may be formed to penetrate the first interlayer insulating layer 190. The bit line plugs BPLG may be electrically connected to the conductive pads 160, respectively. Bit lines BL may be formed on the first interlayer insulating layer 190 so as to be connected to the bit lines plugs BPLG. The bit lines BL may extend in the second direction D2 and may be spaced apart from each other in the first direction D1. The bit lines BL may be vertically spaced apart from the common source lines CSL and may intersect the common source lines CSL.

Figure 6A:
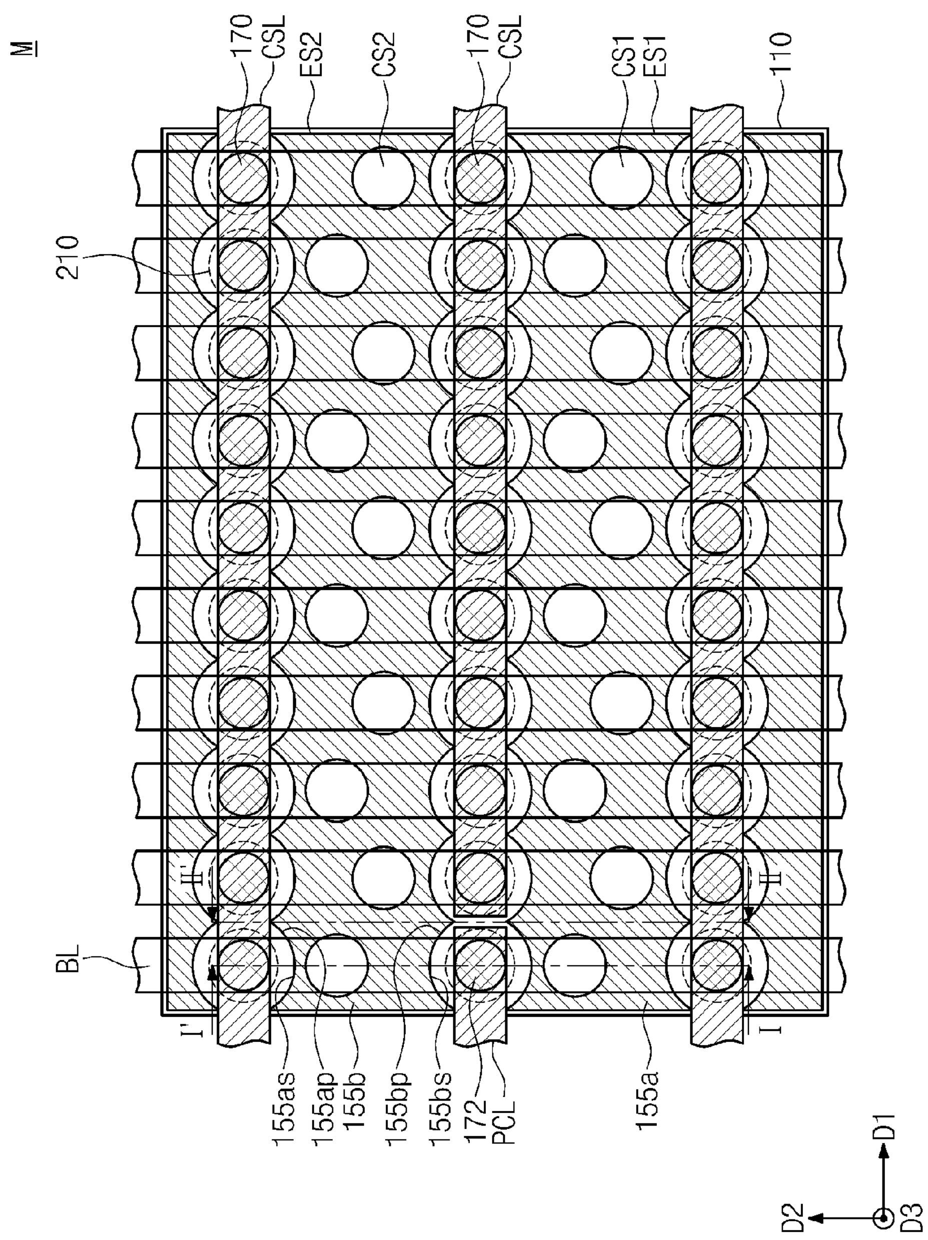
FIG. 6A is an enlarged plan view of a portion 'M' of FIG. 2 to illustrate a cell region of a 3D semiconductor memory device according to other embodiments of the inventive concepts.
Figure 6B:
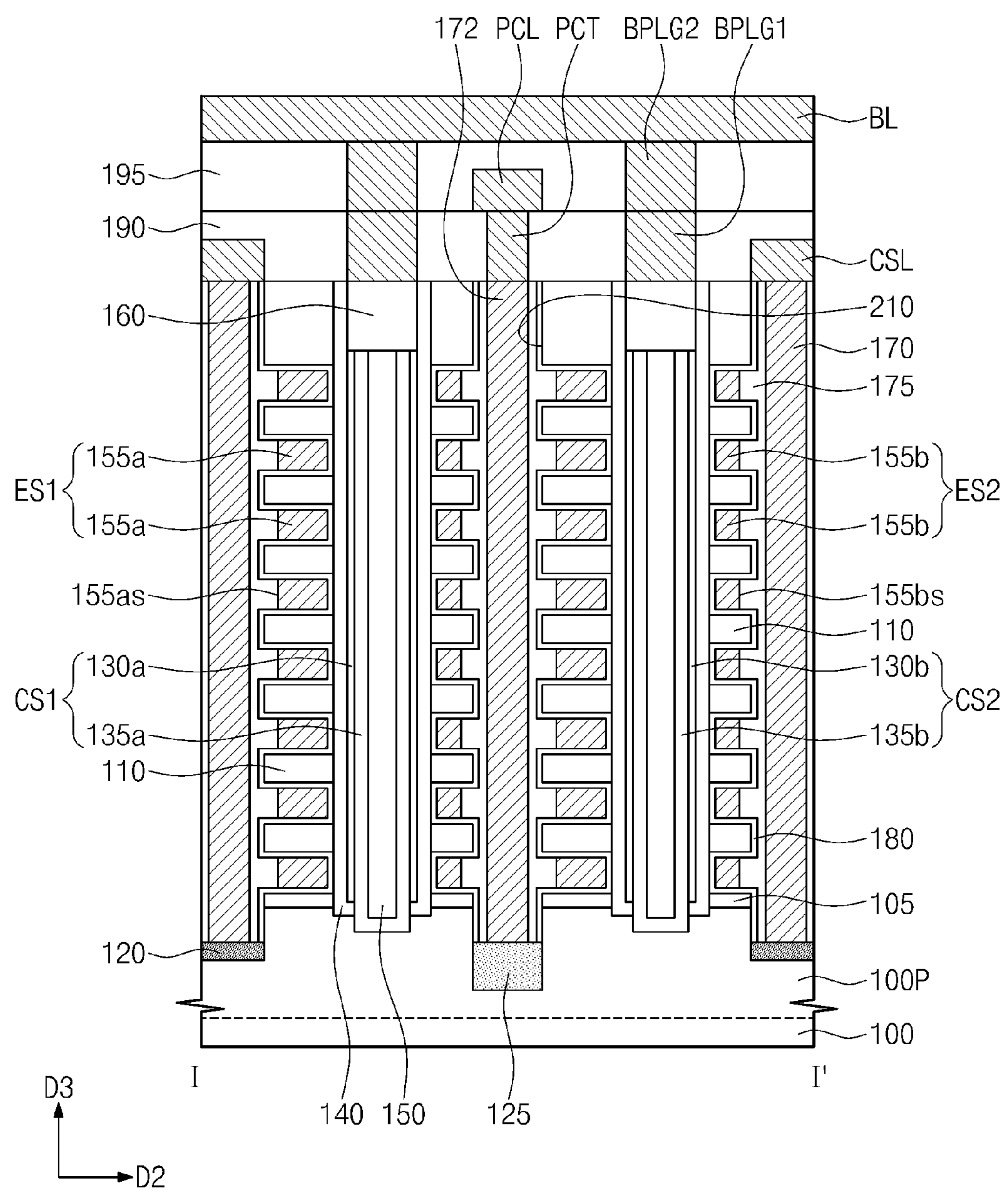
FIG. 6B is a cross-sectional view taken along a line I-I' of FIG. 6A, according to one embodiment.
Figure 6C:
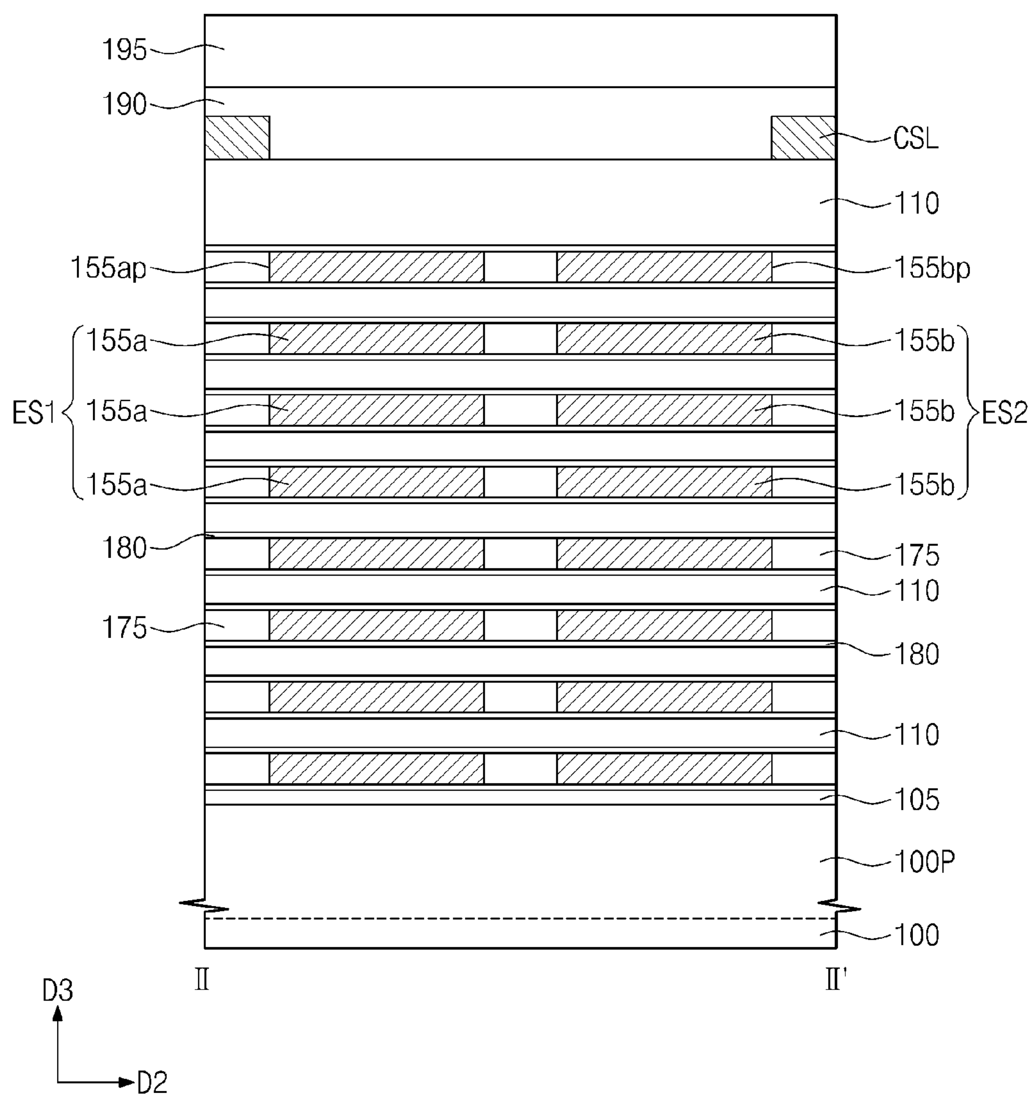
FIG. 6C is a cross-sectional view taken along a line II-II' of FIG. 6A, according to one embodiment.

FIG. 6A is an enlarged plan view of a portion 'M' of FIG. 2 to illustrate a cell region of a 3D semiconductor memory device according to other embodiments of the inventive concepts. FIG. 6B is a cross-sectional view taken along a line I-I' of FIG. 6A, and FIG. 6C is a cross-sectional view taken along a line II-II' of FIG. 6A. In the present embodiment, the same technical features as described with reference to FIGS. 3A to 3C will be omitted or mentioned briefly for the purpose of ease and convenience in explanation. In other words, differences between the present embodiment and the embodiment of FIGS. 3A to 3C will be mainly described. In the present embodiment, the same elements as described in the aforementioned embodiment of FIGS. 3A to 3C will be indicated by the same reference numerals or the same reference designators.

Referring to FIGS. 6A to 6C, a substrate 100 may include a pocket-well dopant layer 100*p* having a first conductivity type. The substrate 100 may further include well pickup regions 125 that are doped with dopants and are formed in the pocket-well dopant layer 100*p*. In the present embodiment, the well pickup regions 125 may be disposed in the pocket-well dopant layer 100*p* around channel structures CS1 and CS2, as illustrated in FIG. 2. In addition, the well pickup region 125 may also be disposed in the pocket-well dopant layer 100*p* between the first and second channel structures CS1 and CS2.

A well contact 172 may be disposed in a through-hole 210 so as to be connected to the well pickup region 125 between the first and second channel structures CS1 and CS2. The well contact 172 may penetrate insulating layers 110 and may be disposed between first and second gate electrode structures ES1 and ES2. In the present embodiment, one well contact 172 is illustrated as an example. However, the inventive concepts are not limited thereto. In other embodiments, the well contact 172 may be provided in plurality.

A well conductive line PCL may be disposed on stack structures SS including the first and second gate electrode structures ES1 and ES2 and the insulating layers 110. The well conductive line PCL may be disposed on a first interlayer insulating layer 190. The well conductive line PCL may extend in the first direction D1 and may be disposed between common source lines CSL in a plan view. The well conductive line PCL may be a conductive pattern (e.g., a metal line) that is vertically spaced apart from the top surface of the substrate 100. The well conductive line PCL may be spaced apart from the common source lines CSL by the first interlayer insulating layer 190.

The well conductive line PCL may be formed on the well contact 172 so as to be electrically connected to the well contact 172. A well contact plug PCT may be disposed between the well conductive line PCL and the well contact 172. In this case, the well conductive line PCL may be electrically connected to the well contact 172 through the well contact plug PCT. A voltage may be applied to the well pickup region 125 connected to the well contact 172 through the well conductive line PCL spaced apart from the substrate 100.

A second interlayer insulating layer 195 may be disposed to cover the well conductive line PCL. A first bit line plug BPLG1 may penetrate the first interlayer insulating layer 190 so as to be electrically connected to the conductive pad 160, and a second bit line plug BPLG2 may penetrate the second interlayer insulating layer 195 so as to be connected to the first bit line plug BPLG1.

Bit lines BL may be disposed on the second interlayer insulating layer 195 to intersect the stack structures SS. The bit lines BL may extend in the second direction D2 and may be spaced apart from each other in the first direction D1. The bit lines BL may be vertically spaced apart from the common source lines CSL and the well conductive line PCL and may intersect the common source lines CSL. The bit lines BL may be electrically connected to the conductive pads 160 through the first and second bit line plugs BPLG1 and BPLG2.

Since the well pickup region 125 is also disposed between the first and second channel structures CS1 and CS2 in the 3D semiconductor memory device according to the present embodiment, a potential of the pocket-well dopant layer 100*p* may be uniform in the cell region CR. In addition, the voltage may be effectively applied to the well pickup region 125 by the well conductive line PCL and the well contact 172.

Figure 7A:
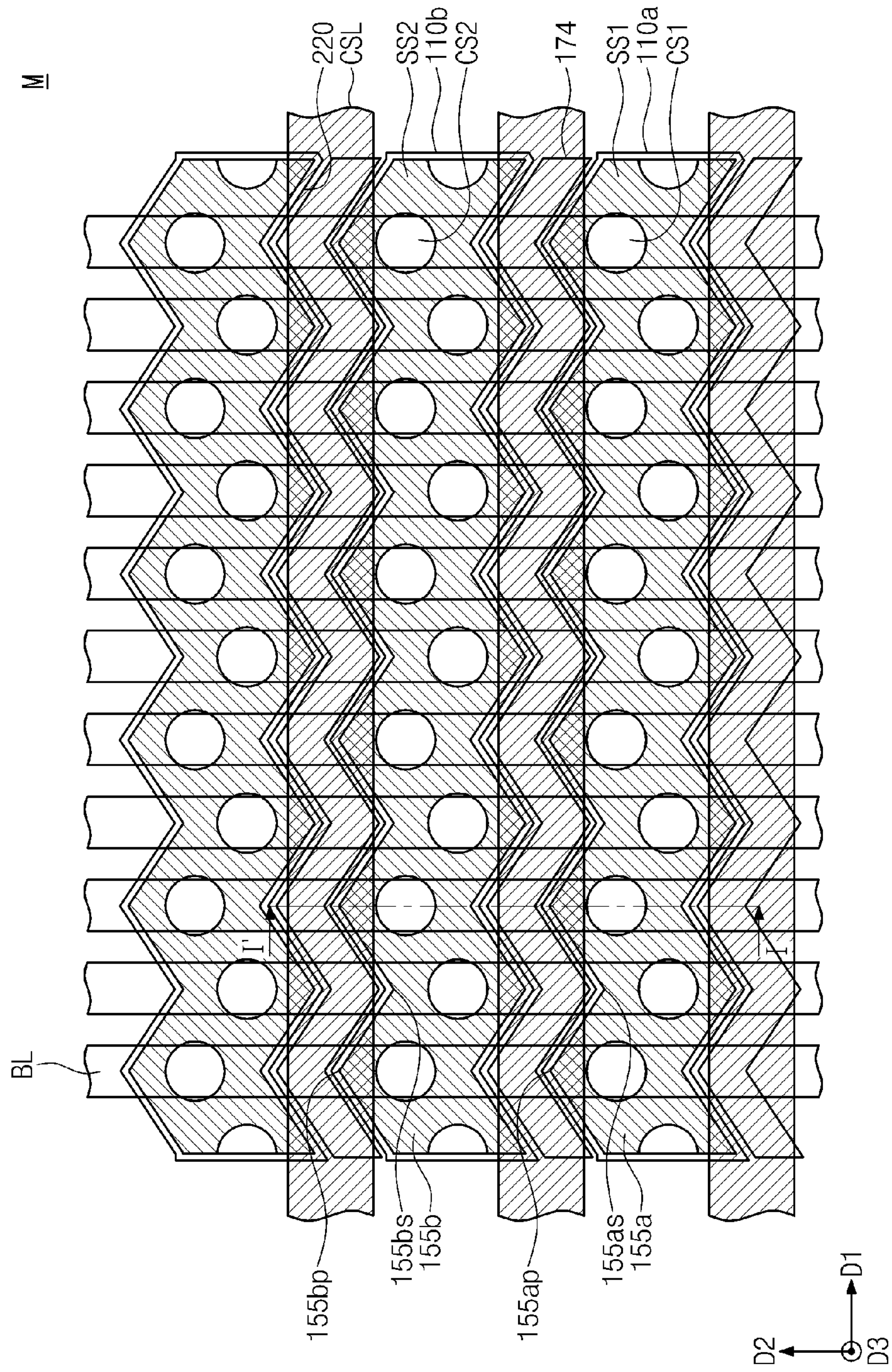
FIG. 7A is an enlarged plan view of a portion 'M' of FIG. 2 to illustrate a cell region of a 3D semiconductor memory device according to still other embodiments of the inventive concepts.
Figure 7B:
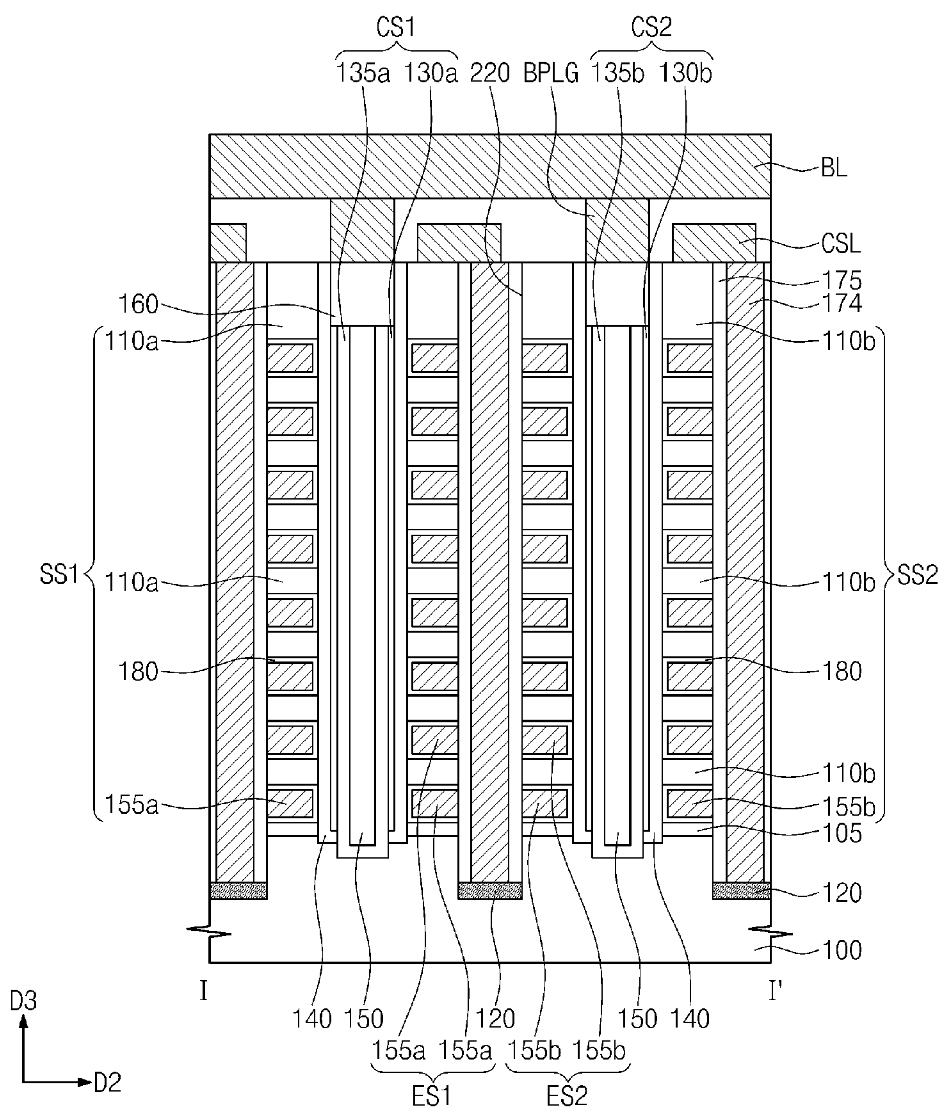
FIG. 7B is a cross-sectional view taken along a line I-I' of FIG. 7A, according to one embodiment.

FIG. 7A is an enlarged plan view of a portion 'M' of FIG. 2 to illustrate a cell region of a 3D semiconductor memory device according to still other embodiments of the inventive concepts. FIG. 7B is a cross-sectional view taken along a line I-I' of FIG. 7A. In the present embodiment, the same technical features as described with reference to FIGS. 3A to 3C will be omitted or mentioned briefly for the purpose of ease and convenience in explanation. Differences between the present embodiment and the embodiment of FIGS. 3A to 3C will be mainly described. In the present embodiment, the same elements as described in the aforementioned embodiment of FIGS. 3A to 3C will be indicated by the same reference numerals or the same reference designators.

Referring to FIGS. 7A and 7B, a plurality of stack structures laterally spaced apart from each other may be disposed on a substrate 100. The plurality of stack structures may include a first stack structure SS1 and a second stack structure SS2. The first stack structure SS1 may include first gate electrodes 155*a* and first insulating layers 110*a* which are alternately and repeatedly stacked on the substrate 100. The second stack structure SS2 may include second gate electrodes 155*b* and second insulating layers 110*b* which are alternately and repeatedly stacked on the substrate 100. Unlike FIGS. 3A to 3C, planar shapes of the first insulating layers 110*a* may correspond to planar shapes of the first gate electrodes 155*a* and planar shapes of the second insulating layers 110*b* may correspond to planar shapes of the second gate electrodes 155*b*. Hereinafter, the first and second stack structures SS1 and SS2 will be mainly described for the purpose of ease and convenience in explanation.

When viewed from a plan view, the first and second stack structures SS1 and SS2 may have line shapes extending in a first direction D1. The shapes of the first and second stack structures SS1 and SS2 will be described later in more detail. Common source regions 120 may be disposed in the substrate 100 between the stack structures. For example, the common source regions 120 and the stack structures may be alternately arranged along a second direction D2 when viewed from a plan view.

First channel structures CS1 may penetrate the first stack structure SS1, and second channel structures CS2 may penetrate the second stack structure SS2. Since the first and second stack structures SS1 and SS2 are spaced apart from each other in the second direction D2, the first channel structures CS1 may be spaced apart from the second channel structures CS2 in the second direction D2. The first channel structures CS1 may be arranged in a zigzag form along the first direction D1, and the second channel structures may also be arranged in a zigzag form along the first direction D1.

Trenches 220 may be formed between the stack structures. For example, the trenches 220 and the stack structures may be alternately arranged along the second direction D2 when viewed from a plan view. Thus, one of the trenches 220 may be formed between the first and second stack structures SS1 and SS2. The trench 220 may extend in a zigzag form along the first direction D1 to separate the first and second stack structures SS1 and SS2 from each other. In the embodiment described with reference to FIGS. 3A to 3C, the insulating layer 110 is formed in one body and the first and second gate electrodes 155*a* and 155*b* are separated from each other on the insulating layer 110. On the other hand, in the present embodiment, the trench 220 may separate the first and second gate electrodes 155*a* and 155*b* from each other and the insulating layer may also be divided into the first insulating layer 110*a* and the second insulating layer 110*b* by the trench 220.

Contact lines 174 may be disposed in the trenches 220 so as to be connected to the common source regions 120, respectively. At least one of the contact lines 174 may be disposed between the first and second stack structures SS1 and SS2. For example, the first stack structure SS1 may be spaced apart from the second stack structure SS2 in the second direction D2 with the contact line 174 interposed therebetween. The contact lines 174 may extend in a zigzag form along the first direction D1 and may be spaced apart from each other in the second direction D2. The contact lines 174 may be conductive patterns (e.g., metal lines) that are connected to the top surface of the substrate 100.

Spacers 175 may be disposed between the contact lines 174 and the stack structures SS1 and SS2. The first and second gate electrodes 155*a* and 155*b* may be electrically insulated from the contact lines 174 by the spacers 175. The spacer 175 may include at least one of a silicon layer, a silicon oxide layer, a silicon carbide layer, a silicon oxynitride layer, or a silicon nitride layer.

Common source lines CSL may be disposed on the contact lines 174, respectively. The common source lines CSL may vertically overlap with the contact lines 174 and may be electrically connected to the contact lines 174. A predetermined voltage may be applied to the common source regions 120 through the contact lines 174 and the common source lines CSL spaced apart from the substrate 100.

The first and second stack structures SS1 and SS2 according to the present embodiment will be described in more detail.

Referring again to FIG. 7A, each of the first and second stack structures SS1 and SS2 may have a line shape that extends in a zigzag form along the first direction D1. Each of the first gate electrodes 155*a* of the first stack structure SS1 may have first depressed sidewalls 155*as* and first protruding sidewalls 155*ap*. Each of the second gate electrodes 155*b* of the second stack structure SS2 may have second depressed sidewalls 155*bs* and second protruding sidewalls 155*bp*. As described above, the planar shapes of the first and second insulating layers 110*a* and 110*b* may be the same as those of the first and second gate electrodes 155*a* and 155*b*, respectively.

When viewed from a plan view, the first depressed sidewalls 155*as* and the first protruding sidewalls 155*ap* may correspond to an arrangement shape of the first channel structures CS1 arranged in the zigzag form. For example, the first channel structures CS1 that are offset from a central axis of the first stack structure SS1 along the second direction D2 may be adjacent to the first protruding sidewalls 155*ap*, respectively. The first depressed sidewall 155*as* may be disposed between the first protruding sidewalls 155*ap* which are adjacent to each other in the first direction D1. Features of the second depressed sidewalls 155*bs* and the second protruding sidewalls 155*bp* may be the same as those of the first depressed sidewalls 155*as* and the first protruding sidewalls 155*ap*.

According to the present embodiment, structural stability of the 3D semiconductor memory device may be improved by the first and second stack structures SS1 and SS2 which extend in the zigzag form along the first direction D1. For example, surface areas of the sidewalls of the stack structures SS1 and SS2 extending in the zigzag form may be wider than those of sidewalls of a line-shaped stack structure, so a stress caused by stack of the gate electrodes and the insulating layers may be effectively dispersed by the stack structures SS1 and SS2. As a result, even though heights of the first and second stack structures SS1 and SS2 increase, it is possible to prevent or reduce a leaning problem of the stack structures SS1 and SS2.

In addition, since the common source lines CSL are spaced apart from the substrate 100, it is possible to minimize or prevent a defect (e.g., a seam) which may be caused in the contact lines 174 and the common source lines CSL. For example, even though lengths of the lines 174 and CSL increase, a resistance increase of the lines 174 and CSL may be minimized.

Figure 8A:
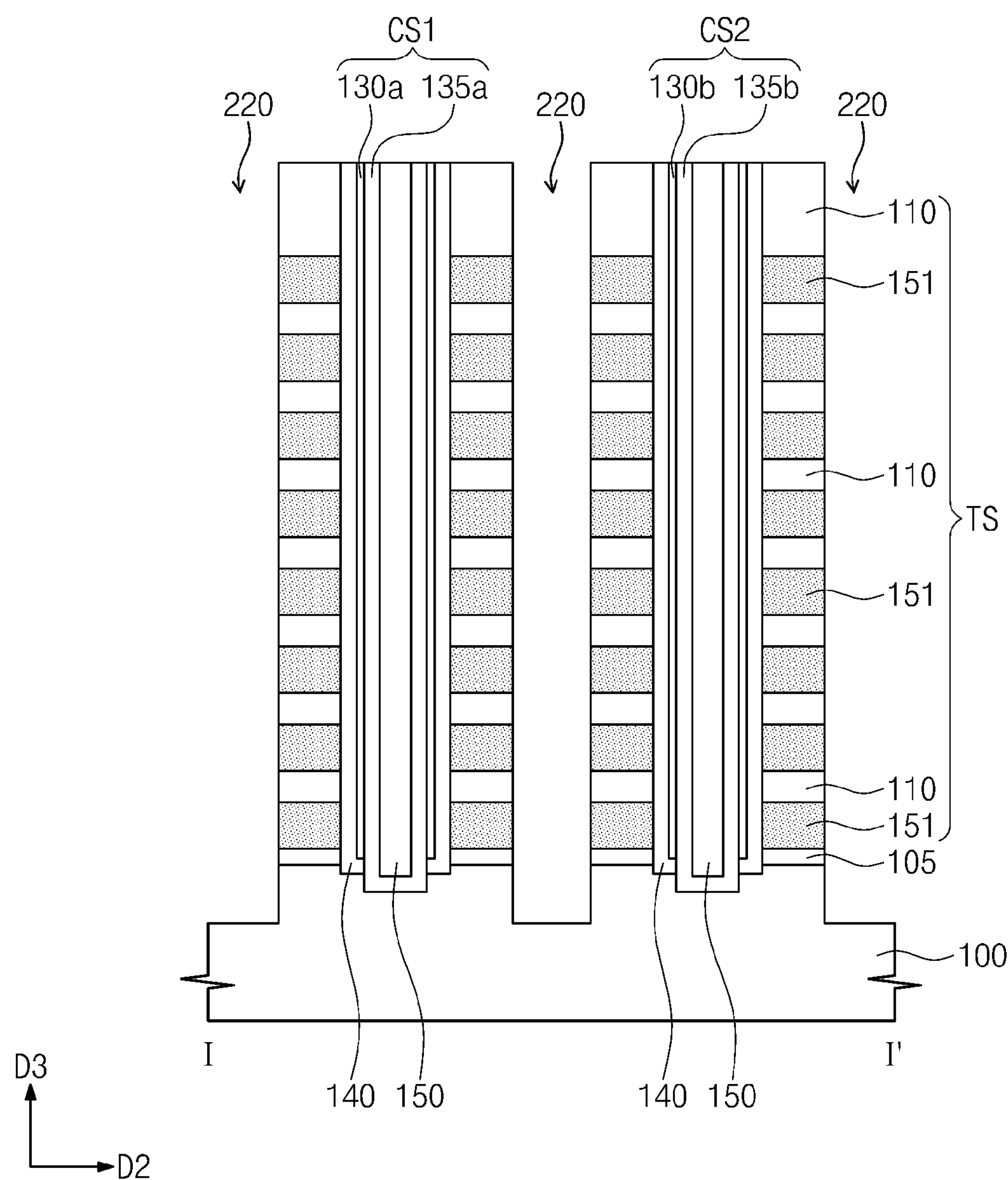
FIGS. 8A to 8C are cross-sectional views corresponding to a line I-I' of FIG. 7A to illustrate a method for manufacturing a 3D semiconductor memory device according to still other embodiments of the inventive concepts.
Figure 8B:
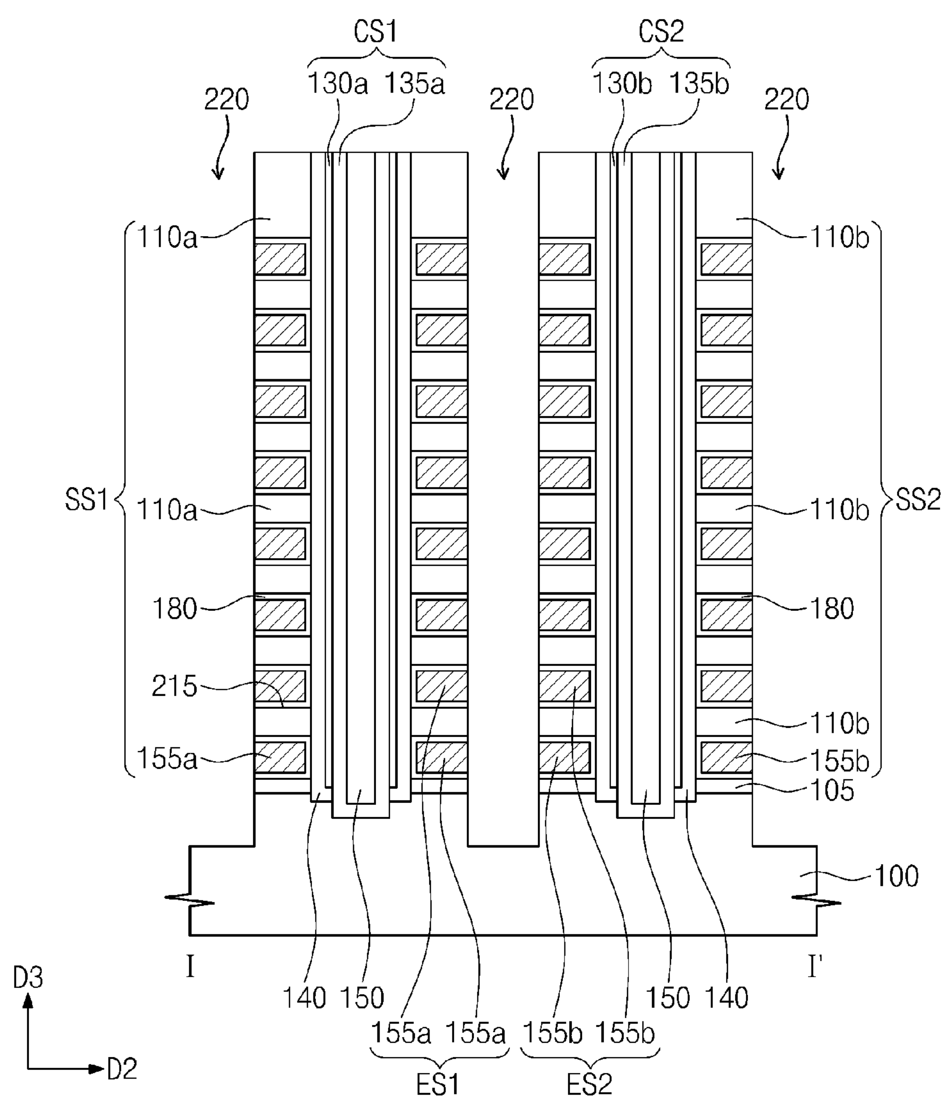
Figure 8C:
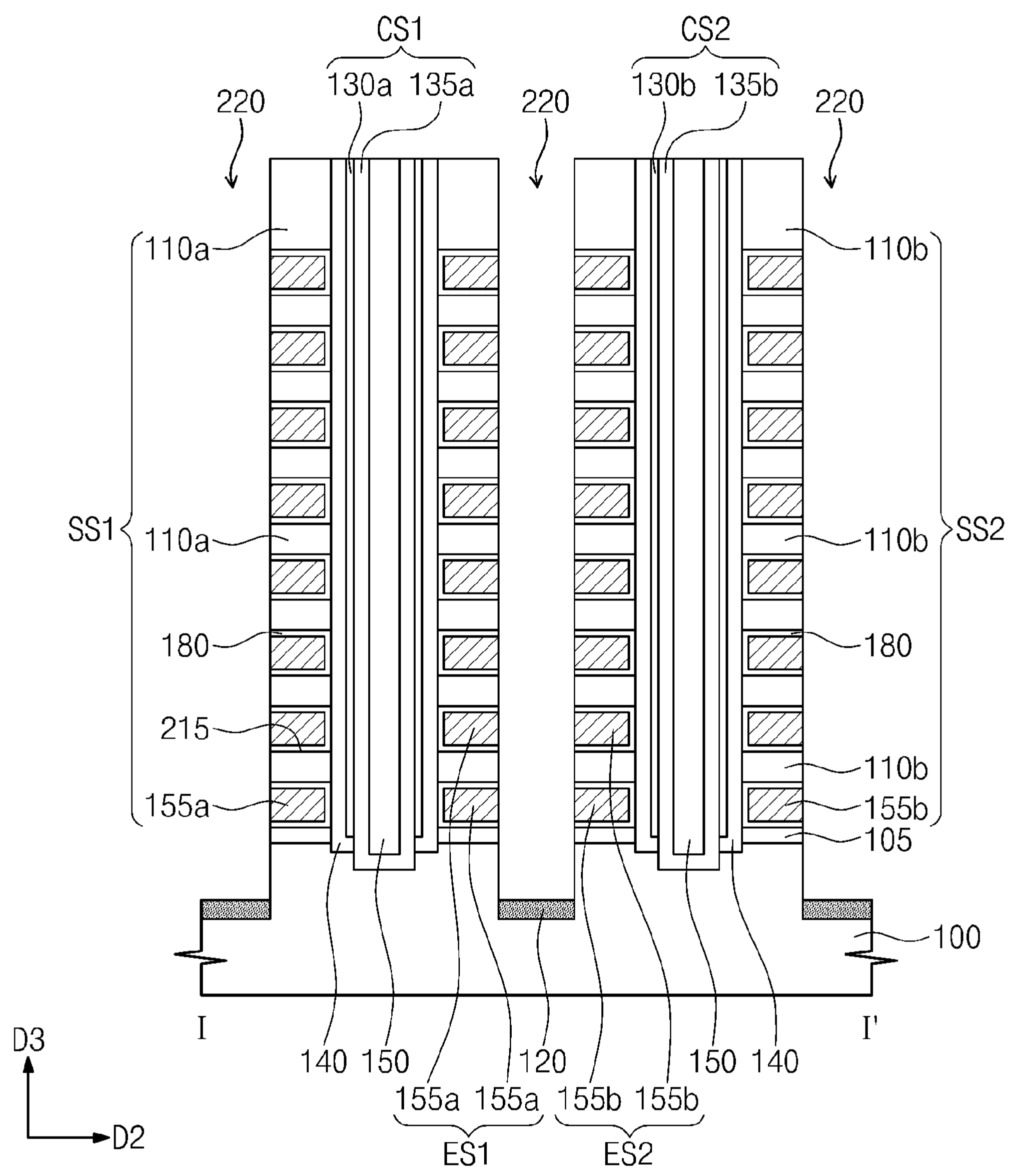

FIGS. 8A to 8C are cross-sectional views corresponding to a line I-I' of FIG. 7A to illustrate a method for manufacturing a 3D semiconductor memory device according to still other embodiments of the inventive concepts. In a manufacturing method of the present embodiment, the same features as described with reference to FIGS. 4A to 4G and 5A and 5B will be omitted or mentioned briefly for the purpose of ease and convenience in explanation. Differences between the present embodiment and the embodiment of FIGS. 4A to 4G and 5A and 5B will be mainly described.

Referring to FIGS. 7A and 8A, the thin layer structure TS of the resultant structure of FIG. 4D may be patterned to form trenches 220 which expose the substrate 100. The trenches 220 may be formed between the rows of the channel holes including the first and second channel holes 200*a* and 200*b*. The row of the first channel holes 200*a* and the row of the second channel holes 200*b* may be defined by the trenches 220. The trenches 220 may further penetrate the lower insulating layer 105.

Forming the trenches 220 may include forming second mask patterns (not shown) defining the trenches 220 on the thin layer structure TS and etching the thin layer structure TS using the second mask patterns as an etch mask. Each of the trenches 220 may be formed between the second mask patterns adjacent to each other when viewed from a plan view. The trenches 220 may expose sidewalls of the sacrificial layers 151 and sidewalls of the insulating layers 110. When viewed from a plan view, each of the trenches 220 may have a line shape which extends in a zigzag form along the first direction D1. In a cross-sectional view, the trenches 220 may expose the top surface of the substrate 100. In addition, due to the etching process, a width of the trench 220 may be varied depending on a vertical height from the substrate 100.

Planar shapes of the second mask patterns may correspond to the planar shapes of the first and second stack structures SS1 and SS2 described with reference to FIGS. 7A and 7B. Thus, when the trenches 220 are formed, the planar shapes of the first and second stack structures SS1 and SS2 may be defined.

Referring to FIG. 8B, the sacrificial layers 151 exposed by the trenches 220 may be selectively removed to form recess regions 215. The recess regions 215 may be gap regions that horizontally extend from the trenches 220. The recess regions 215 may expose sidewalls of the vertical insulators 140.

Gate dielectric layers 180 may be formed in the recess regions 215, respectively. The gate dielectric layers 180 may cover inner surfaces of the recess regions 215, respectively. First gate electrodes 155*a* and second gate electrodes 155*b* may be formed to fill the rest regions of the recess regions 215, respectively. Forming the gate dielectric layers 180 and the first and second gate electrodes 155*a* and 155*b* may include sequentially forming a dielectric layer and a gate layer (e.g., a metal layer) on the substrate 100 having the recess regions 215 and removing the dielectric layer and the gate layer which are disposed outside the recess regions 215.

In the present embodiment, the thin layer structure TS may be etched to have the zigzag-shaped patterns. Thus, the dielectric layer and the gate layer may fill the recess regions 215 without a defect such as a seam or a void. As a result, it is possible to minimize or prevent a pattern modification problem of the gate electrodes 155*a* and 155*b*.

The first gate electrodes 155*a* and first insulating layers 110*a* which are alternately stacked may constitute the first stack structure SS1, and the second gate electrodes 155*b* and second insulating layers 110*b* which are alternately stacked may constitute the second stack structure SS2.

Referring to FIGS. 7A and 8C, common source regions 120 may be formed in the substrate 100 after the formation of the first and second gate electrodes 155*a* and 155*b*.

Referring again to FIGS. 7A and 7B, spacers 175 partially filling the trenches 220 may be formed on the common source regions 120.

Contact lines 174 may be formed in the trenches 220 having the spacers 175, respectively. The contact lines 174 may be connected to the common source regions 120, respectively. The contact lines 174 may extend in the first direction D1 and may be spaced apart from each other in the second direction D2. Each of the spacers 175 may be disposed between each of the contact lines 174 and each of the stack structures SS1 and SS2. The first and second gate electrodes 155*a* and 155*b* may be electrically insulated from the contact lines 174 by the spacers 175.

Conductive pads 160 may be formed to be connected to the first and second channel structures CS1 and CS2, respectively. Subsequently, common source lines CSL connected to the contact lines 174 may be formed. A first interlayer insulating layer 190 may be formed on the common source lines CSL. Bit line plugs BPLG which are electrically connected to the conductive pads 160 may be formed to penetrate the first interlayer insulating layer 190. Bit lines BL which are connected to the bit line plugs BPLG may be formed on the first interlayer insulating layer 190.

Figure 9:
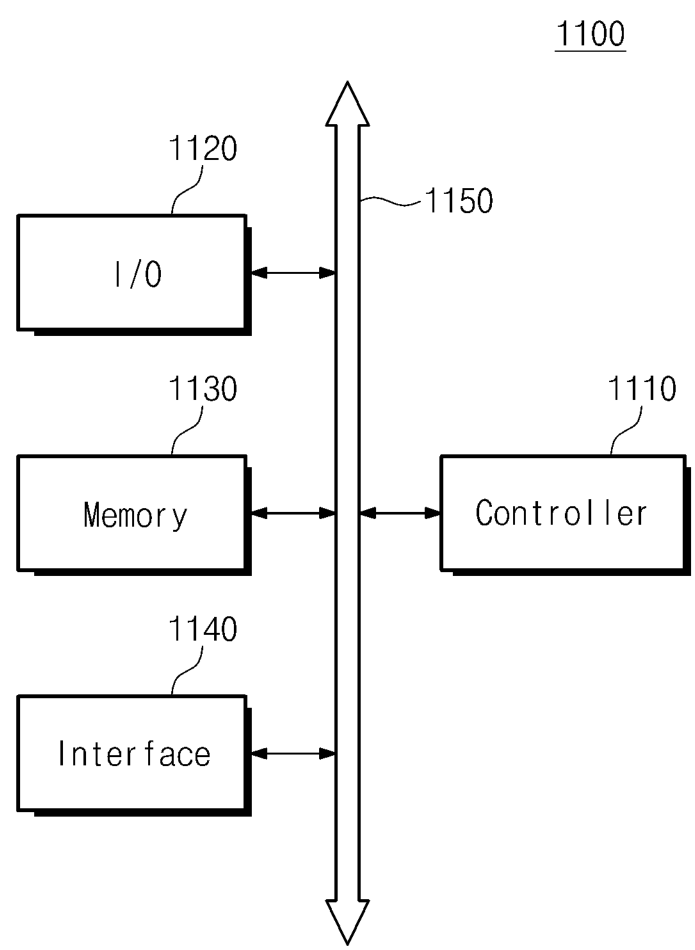
FIG. 9 is a schematic block diagram illustrating an example of a memory system including a 3D semiconductor memory device according to embodiments of the inventive concepts.

FIG. 9 is a schematic block diagram illustrating an example of a memory system including a 3D semiconductor memory device according to embodiments of the inventive concepts.

Referring to FIG. 9, a memory system 1100 may be used in an electronic device such as a personal digital assistant (PDA), a portable computer, a web tablet, a wireless phone, a mobile phone, a digital music player, a memory card, or other electronic products receiving and/or transmitting information data by wireless or wired communication.

The memory system 1100 may include a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices. Functions of the other logic devices may be a similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include at least one of the 3D semiconductor memory devices according to the aforementioned embodiments of the inventive concepts. The memory device 1130 may further include at least one of another type of semiconductor memory devices and volatile random access memory devices. The memory devices described herein may be more generally referred to as semiconductor devices. Further, a semiconductor device may generally refer to any of the various devices such as shown in FIGS. 1-8C, and may also refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

The interface unit 1140 may transmit electrical data to a communication network or may receive electrical data from a communication network.

The 3D semiconductor memory device or the memory system according to the above embodiments may be encapsulated using various packaging techniques. For example, the 3D semiconductor memory device or the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 10:
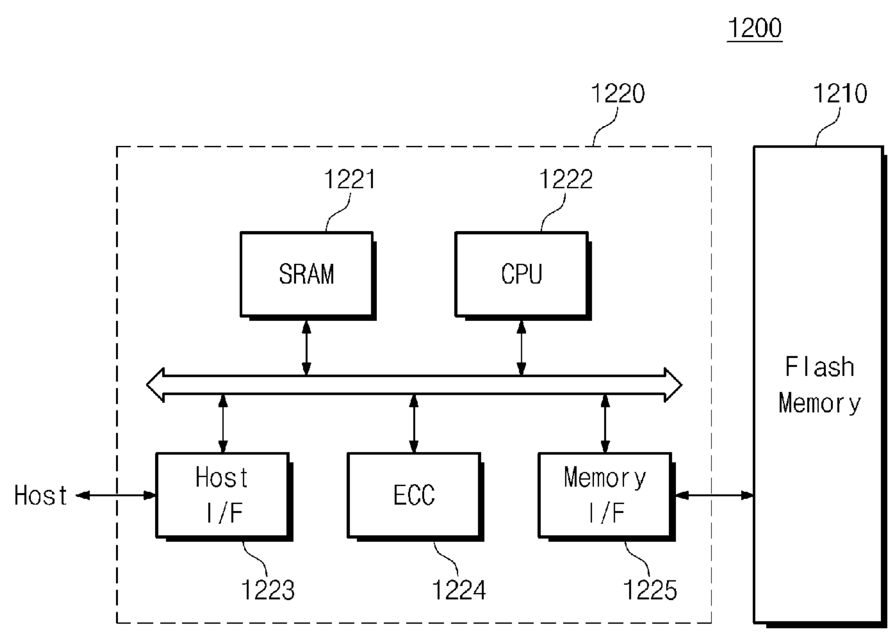
FIG. 10 is a schematic block diagram illustrating an example of a memory card including a 3D semiconductor memory device according to embodiments of the inventive concepts.

FIG. 10 is a schematic block diagram illustrating an example of a memory card including a 3D semiconductor memory device according to embodiments of the inventive concepts.

Referring to FIG. 10, a memory card 1200 for storing high-capacity data may include a flash memory device 1210 implemented with at least one of the 3D semiconductor memory devices according to the aforementioned embodiments of the inventive concepts. The memory card 1200 may further include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the data storage device 1200 and the host. An error correction code (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may further include a read only memory (ROM) storing code data for interfacing with the host.

Figure 11:
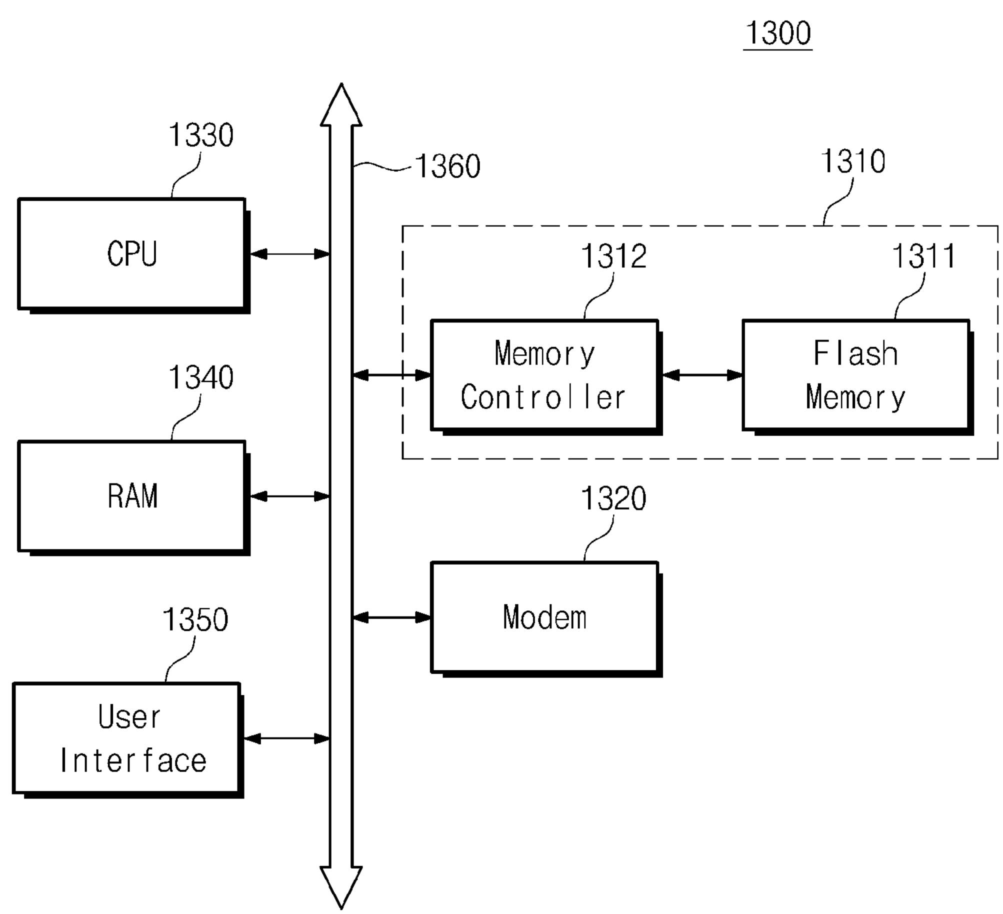
FIG. 11 is a schematic block diagram illustrating an example of an information processing system including a 3D semiconductor memory device according to embodiments of the inventive concepts.

FIG. 11 is a schematic block diagram illustrating an example of an information processing system including a 3D semiconductor memory device according to embodiments of the inventive concepts.

Referring to FIG. 11, an information processing system 1300 (e.g., a mobile device or a desk top computer) may include a flash memory system 1310 implemented with at least one of the 3D semiconductor memory devices according to the aforementioned embodiments of the inventive concepts. The information processing system 1300 may further include a modem 1320, a central processing unit (CPU) 1330, a random access memory (RAM) device 1340, and a user interface unit 1350 which are electrically connected to the flash memory system 1310 through a system bus 1360. The flash memory system 1310 may be a substantially same as the memory system or the memory card described above. The flash memory system 1310 may store data inputted from an external system and/or data processed by the CPU 1330. In some embodiments, the flash memory system 1310 may be realized as a solid state disk (SSD). In this case, the information processing system 1300 may stably store massive data into the flash memory system. In addition, as reliability of the flash memory system 1310 may increase, the flash memory system 1310 may reduce a resource consumed for correcting errors. Thus, the information processing system 1300 may perform a high-speed data exchange function. Even though not shown in the drawings, an application chipset, a camera image processor (CIS), and an input/output unit may further be provided in the information processing system 1300.

According to embodiments of the inventive concepts, since the insulating layer formed in one body supports the gate electrodes laterally spaced apart from each other, the structural stability of the stack structure may be improved. In addition, it is possible to minimize or prevent the pattern modification and resistance increase problems of the gate electrodes. Furthermore, the common source line may be vertically spaced apart from the substrate, so the defect (e.g., the seam) may not be caused in the common source line.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:

an insulating layer provided in one body on a substrate and configured to extend between adjacent contacts of a plurality of contacts in first and second directions perpendicular to each other;

a first gate electrode and a second gate electrode disposed on the insulating layer, the first and second gate electrodes extending in the first direction parallel to a top surface of the substrate;

a first channel structure penetrating the first gate electrode and the insulating layer so as to be connected to the substrate;

a second channel structure penetrating the second gate electrode and the insulating layer so as to be connected to the substrate; and wherein the adjacent contacts penetrate the insulating layer between the first gate electrode and the second gate electrode and are connected to common source regions formed in the substrate, the common source regions having a first conductivity type, wherein the first gate electrode and the second gate electrode are spaced apart from each other in a second direction at the same level from the substrate, and wherein the second direction intersects the first direction and is parallel to the top surface of the substrate.

2. The semiconductor device of claim 1, wherein the insulating layer, the first gate electrode, and the second gate electrode constitute a unit structure, wherein the unit structure includes a plurality of unit structures repeatedly stacked on the substrate, wherein the first gate electrodes stacked with the insulating layers interposed therebetween constitute a first gate electrode structure, wherein the second gate electrodes stacked with the insulating layers interposed therebetween constitute a second gate electrode structure, and wherein the first gate electrode structure and the second gate electrode structure are spaced apart from each other in the second direction with the contact interposed therebetween.

3. The semiconductor device of claim 1, wherein each of the first and second gate electrodes includes a recessed sidewall, wherein the recessed sidewalls are adjacent to the contact, and wherein the contact is surrounded by the recessed sidewalls when viewed from a plan view.

4. The semiconductor device of claim 3, wherein a distance between the contact and an inner sidewall of the insulating layer adjacent to the contact is smaller than a distance between the contact and each of the depressed sidewalls.

5. The semiconductor device of claim 1, wherein the insulating layer supports both the first gate electrode and the second gate electrode, wherein the insulating layer includes through holes penetrating the insulating layer between the first and second gate electrodes, wherein the adjacent contacts are disposed in the through-holes when viewed from a plan view.

6. The semiconductor device of claim 1, wherein the plurality of contacts are arranged along the first direction and are spaced apart from each other, wherein each of the first and second gate electrodes includes a protruding sidewall, and wherein the protruding sidewalls are disposed between the adjacent contacts.

7. The semiconductor device of claim 6, further comprising:

a common source line extending in the first direction, wherein the common source line is disposed on the contacts and is electrically connected to the contacts.

8. The semiconductor device of claim 7, further comprising:

a bit line extending in the second direction, wherein the bit line is disposed on the first and second channel structures and is electrically connected to the first and second channel structures, and wherein the bit line is vertically spaced apart from the common source line.

9. The semiconductor device of claim 1, wherein the contacts are arranged in the first direction and are spaced apart from each other, wherein at least one of the contacts is connected to a well pickup region formed in the substrate, and wherein the well pickup region has a second conductivity type.

10. The semiconductor device of claim 1, further comprising:

a gate dielectric layer covering top surfaces and bottom surfaces of the first and second gate electrodes and disposed between the first gate electrode and the first channel structure and between the second gate electrode and the second channel structure, wherein the gate dielectric layer extends to cover a top surface and an inner sidewall of the insulating layer.

11. The semiconductor device of claim 1, wherein the first channel structure includes a plurality of first channel structures, wherein the first channel structures are arranged in the first direction and are spaced apart from each other, wherein the second channel structure includes a plurality of second channel structures, wherein the second channel structures are arranged in the first direction and are spaced apart from each other, wherein the contacts are arranged in the first direction between the first channel structures and the second channel structures and are spaced apart from each other, wherein the insulating layer surrounds sidewalls of the first channel structures, sidewalls of the second channel structures, and sidewalls of the contacts.

12. The semiconductor device of claim 1, further comprising:

a first vertical insulator disposed between the first gate electrode and the first channel structure; and a second vertical insulator disposed between the second gate electrode and the second channel structure, wherein each of the first and second vertical insulators includes a charge storage layer.

13. The semiconductor device of claim 2, wherein the first channel structure penetrates the first gate electrode structure, and wherein the second channel structure penetrates the second gate electrode structure.

14. A semiconductor device comprising:

an insulating layer disposed on a substrate and configured to extend between adjacent contacts of a plurality of contacts in first and second directions perpendicular to each other; and a first gate electrode and a second gate electrode disposed on the insulating layer, the first and second gate electrodes extending in the first direction parallel to a top surface of the substrate, wherein the first gate electrode comprises: first recessed sidewalls; and first protruding sidewalls of which each is defined by two, adjacent to each other, of the first recessed sidewalls, wherein the second gate electrode comprises: second recessed sidewalls; and second protruding sidewalls of which each is defined by two, adjacent to each other, of the second recessed sidewalls, wherein the insulating layer is provided in one body to support both the first gate electrode and the second gate electrode, wherein the first gate electrode and the second gate electrode are spaced apart from each other in a second direction at the same level from the substrate, and wherein the second direction intersects the first direction and is parallel to the top surface of the substrate.

15. The semiconductor device of claim 14, further comprising: a common source line vertically spaced apart from the substrate and the first and second gate electrodes, wherein the common source line extends in the first direction, and wherein the common source line is disposed between the first gate electrode and the second gate electrode when viewed from a plan view.

16. The semiconductor device of claim 15, wherein the first gate electrode includes a plurality of first gate electrodes, and the second gate electrode includes a plurality of second gate electrodes, wherein the insulating layers, the first gate electrodes, and the second gate electrodes are repeatedly stacked on the substrate, wherein the first gate electrodes are vertically stacked with the insulating layers interposed therebetween and constitute a first gate electrode structure, wherein the second gate electrodes are vertically stacked with the insulating layers interposed therebetween and constitute a second gate electrode structure, and wherein the first gate electrode structure is spaced apart from the second gate electrode structure in the second direction with the common source line interposed therebetween when viewed from a plan view.

17. The semiconductor device of claim 15, further comprising:

a contact penetrating the insulating layer and disposed between the first gate electrode and the second gate electrode, wherein the contact is disposed between the substrate and the common source line, and wherein the common source line is electrically connected to the substrate through the contact.

18. The semiconductor device of claim 17, wherein one of the first recessed sidewalls and one of the second recessed sidewalls are adjacent to the contact, and wherein the contact is surrounded by the one of the first recessed sidewalls and the one of the second recessed sidewalls when viewed from a plan view.

19. The semiconductor device of claim 14, further comprising:

first channel structures penetrating the first gate electrode and the insulating layer so as to be connected to the substrate, the first channel structures arranged in the first direction; and second channel structures penetrating the second gate electrode and the insulating layer so as to be connected to the substrate, the second channel structures arranged in the first direction.

20. A semiconductor device comprising:

a stack structure including gate electrodes and insulating layers that are alternately and repeatedly stacked on a substrate;

a common source line disposed on the stack structure and extending in a first direction parallel to a top surface of the substrate; and channel structures penetrating the stack structure and arranged in the first direction, the channel structures spaced apart from each other, wherein each of the gate electrodes is divided into segments that are spaced apart from each other in a second direction with the common source line interposed therebetween when viewed from a plan view, wherein each of the insulating layers is not divided in the first and second directions under the common source line so that each of the insulating layers is configured to extend between adjacent channel structures, and wherein the second direction intersects the first direction and is parallel to the top surface of the substrate.

* * * * *